United States Patent
Clark et al.

(10) Patent No.: US 7,649,216 B1
(45) Date of Patent: Jan. 19, 2010

(54) TOTAL IONIZING DOSE RADIATION HARDENING USING REVERSE BODY BIAS TECHNIQUES

(75) Inventors: Lawrence T. Clark, Phoenix, AZ (US); Karl C. Mohr, Phoenix, AZ (US); Keith E. Holbert, Gilbert, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 12/117,416

(22) Filed: May 8, 2008

Related U.S. Application Data

(60) Provisional application No. 60/916,762, filed on May 8, 2007.

(51) Int. Cl.
*H01L 27/10* (2006.01)
*H01L 29/73* (2006.01)
*H01L 29/739* (2006.01)

(52) U.S. Cl. .................. 257/208; 257/202; 257/207; 257/921; 257/E21.328; 257/E21.471

(58) Field of Classification Search ............ 257/921, 257/E21.328, E21.471, 202, 207–208
See application file for complete search history.

(56) References Cited

U.S. PATENT DOCUMENTS

| | | | | |
|---|---|---|---|---|
| 4,668,973 A * | 5/1987 | Dawson et al. | ............... | 257/637 |
| 4,816,706 A * | 3/1989 | Dhong et al. | ............... | 327/57 |
| 5,796,274 A * | 8/1998 | Willis et al. | ............... | 327/63 |
| 6,608,506 B2 * | 8/2003 | Ang et al. | ............... | 327/108 |
| 6,777,753 B1 | 8/2004 | Summers et al. | | |
| 7,471,523 B2 * | 12/2008 | Yang | ............... | 363/21.13 |
| 7,532,501 B2 * | 5/2009 | Joshi et al. | ............... | 365/154 |
| 2002/0031032 A1 * | 3/2002 | Ooishi | ............... | 365/226 |
| 2002/0140496 A1 * | 10/2002 | Keshavarzi et al. | ............... | 327/534 |
| 2002/0191439 A1 * | 12/2002 | Caywood | ............... | 365/185.06 |
| 2005/0161744 A1 * | 7/2005 | Frapreau et al. | ............... | 257/368 |
| 2006/0250843 A1 * | 11/2006 | Bertin et al. | ............... | 365/185.08 |
| 2007/0176641 A1 * | 8/2007 | Kursun et al. | ............... | 326/97 |

OTHER PUBLICATIONS

Benz, Harry F. et al., "Low Power Radiation Tolerant VLSI for Advanced Spacecraft," IEEE Aerospace Conference Proceedings, 2002, pp. 5-22401 to 5-2406, vol. 5.

(Continued)

*Primary Examiner*—Ida M Soward
(74) *Attorney, Agent, or Firm*—Withrow & Terranova, P.L.L.C.

(57) ABSTRACT

The present invention relates to radiation hardening by design (RHBD), which employs layout and circuit techniques to mitigate the damaging effects of ionizing radiation. Reverse body biasing (RBB) of N-type metal-oxide-semiconductor (NMOS) transistors may be used to counteract the effects of trapped positive charges in isolation oxides due to ionizing radiation. In a traditional MOS integrated circuit, input/output (I/O) circuitry may be powered using an I/O power supply voltage, and core circuitry may be powered using a core power supply voltage, which is between the I/O power supply voltage and ground. However, in one embodiment of the present invention, the core circuitry is powered using a voltage difference between the core power supply voltage and the I/O power supply voltage. The bodies of NMOS transistors in the core circuitry are coupled to ground; therefore, a voltage difference between the core power supply voltage and ground provides RBB.

20 Claims, 22 Drawing Sheets

OTHER PUBLICATIONS

Clark, Lawrence T. et al., "An Embedded 32-b Microprocessor Core for Low-Power and High-Performance Applications," IEEE Journal of Solid-State Circuits, Nov. 2001, pp. 1599-1608, vol. 36, No. 11, IEEE.

Clark, Lawrence T. et al., "Standby Power Management for a 0.18um Microprocessor," Proceedings of the ISLPED, Aug. 2002, pp. 7-12.

Flautner, Krisztian et al., "Drowsy Caches: Simple Techniques for Reducing Leakage Power," Proceedings of the ISCA, May 2002, pp. 148-157, ISCA.

Haugerud, Becca M. et al., "The Impact of Substrate Bias on Proton Damage in 130 nm CMOS Technology," Radiation Effects Data Workshop Record, Jul. 2005, pp. 117-121.

Lacoe, Ronald C. et al., "Application of Hardness-By-Design Methodology to Radiation-Tolerant ASIC Technologies," IEEE Transactions on Nuclear Science, Dec. 2000, pp. 2334-2341, vol. 47, No. 6, IEEE.

Martin, M. N. et al., "Analog Rad-Hard by Design Issues," Proceedings of the 11th Annual NASA Symposium on VLSI Design, 2003.

Mizuno, Hiroyuki et al., "Driving Source-Line Cell Architecture for Sub-1-V High-Speed Low-Power Applications," IEEE Journal of Solid-State Circuits, Apr. 1996, pp. 552-557, vol. 31, No. 4, IEEE.

Oldham, T. R. et al., "Total Ionizing Dose Effects in MOS Oxides and Devices," IEEE Transactions on Nuclear Science, Jun. 2003, pp. 483-499, vol. 50, No. 3, IEEE.

Seevinck, Evert et al., "Static-Noise Margin Analysis of MOS SRAM Cells," IEEE Journal of Solid-State circuits, Oct. 1987, pp. 748-754, vol. SC-22, No. 5, IEEE.

Shaneyfelt, M. R. et al., "Charge Yield for Cobalt-60 and 10-keV X-Ray Irradiations of MOS Devices," IEEE Transactions on Nuclear Science, Dec. 1991, pp. 1187-1194, vol. 38, No. 6, IEEE.

Xapsos, M. A. et al., "Enhanced Total Ionizing Dose Tolerance of Bulk CMOS Transistors Fabricated for Ultra-Low Power Applications," IEEE Transactions on Nuclear Science, Dec. 1999, pp. 1697-1701, vol. 46, No. 6, IEEE.

* cited by examiner

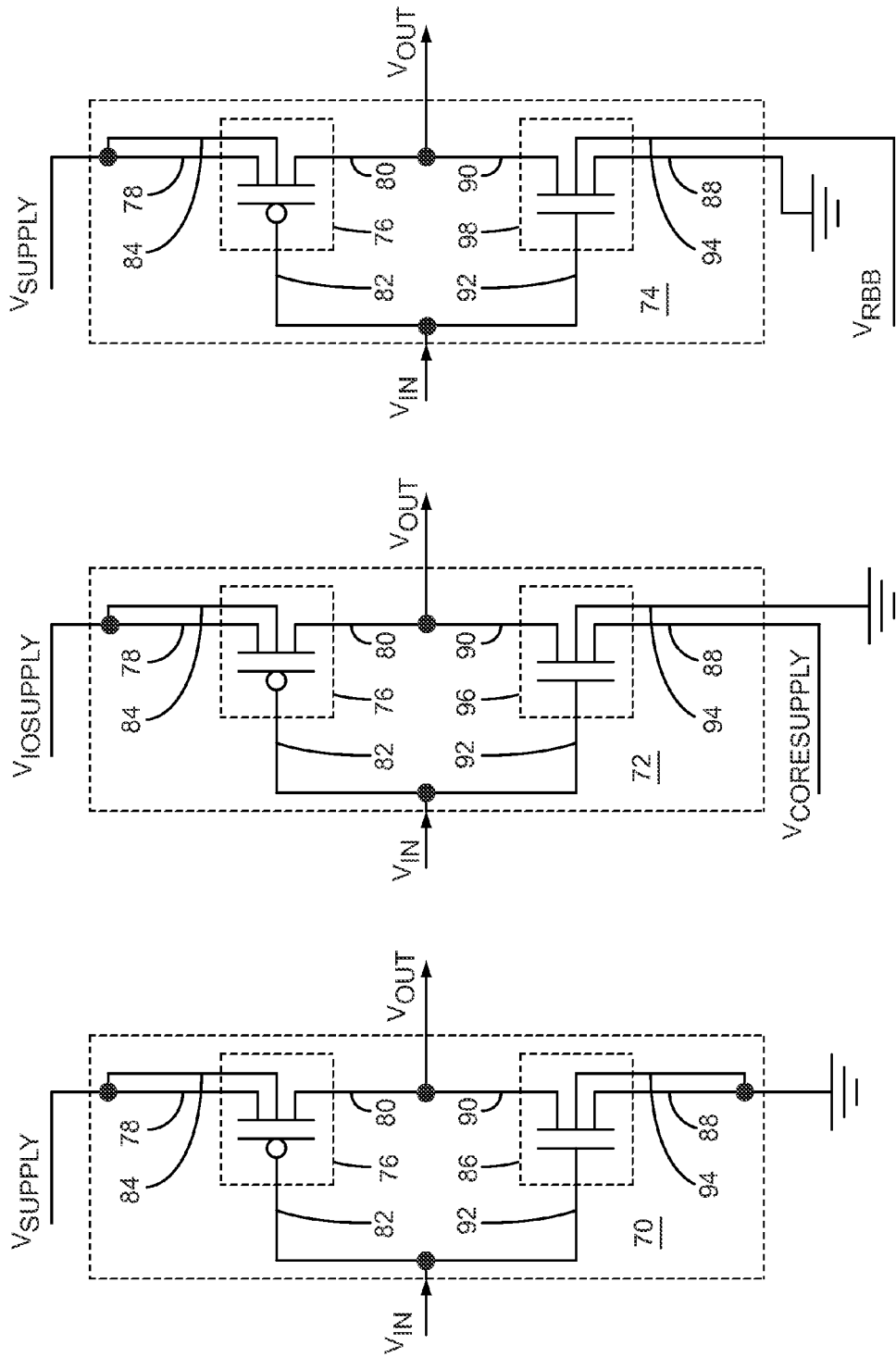

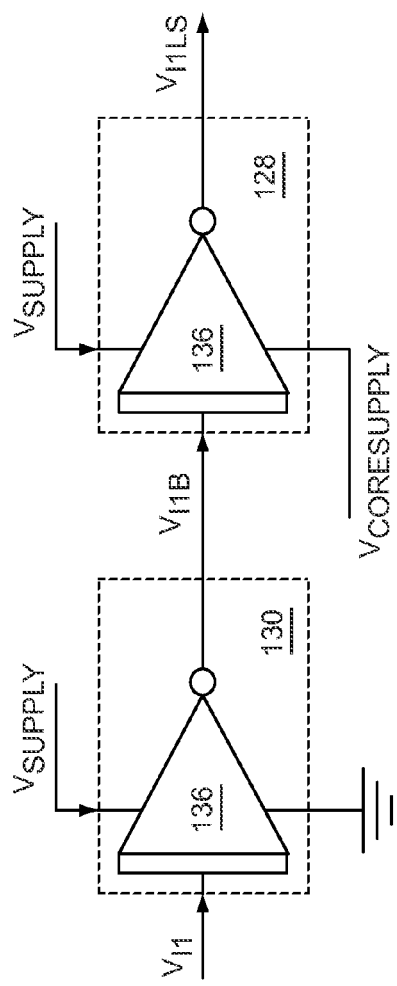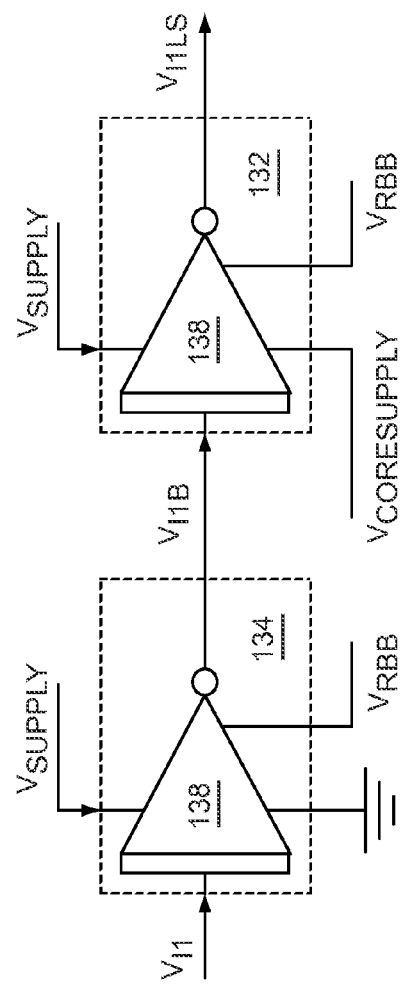

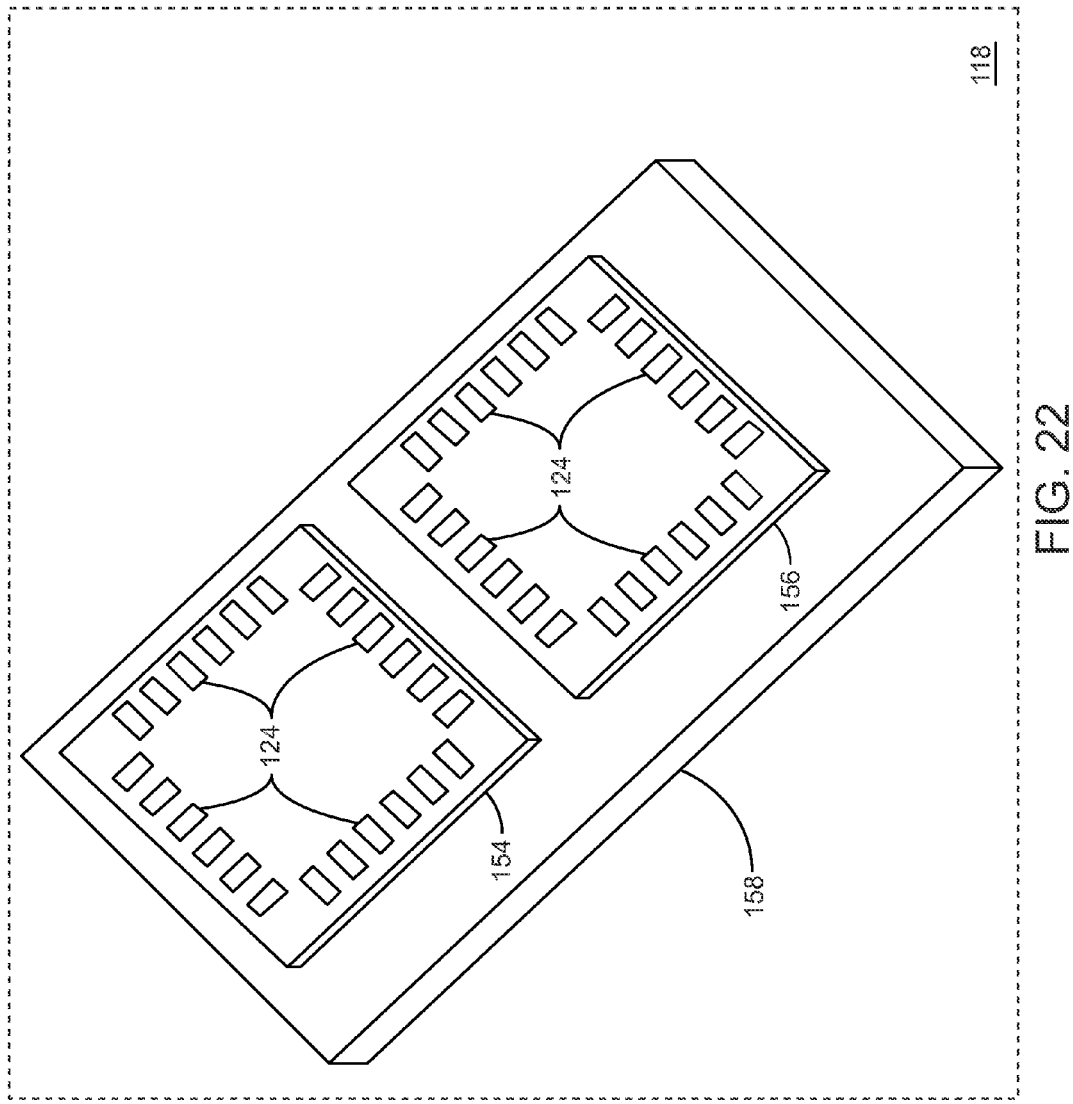

TOTAL IONIZING DOSE RADIATION HARDENING USING REVERSE BODY BIAS TECHNIQUES

This application claims the benefit of provisional patent application Ser. No. 60/916,762, filed May 8, 2007, the disclosure of which is hereby incorporated herein by reference in its entirety.

GOVERNMENT FUNDING

The invention described herein was made with government support under grant number F29601-02-2-299, awarded by the Air Force Research Laboratory. The United States Government has certain rights in the invention.

FIELD OF THE INVENTION

The present invention relates to radiation hardening of semiconductor circuits and devices, such as complementary metal-oxide-semiconductor (CMOS) circuits and devices.

BACKGROUND OF THE INVENTION

High-radiation environments may be associated with systems ranging from military and aeronautical to commercial and industrial. For example, outer space instrumentation has to operate in high-radiation environments. Depending on a particular mission, the high-radiation environments may include solar and cosmic radiation as well as trapped high energy electron and proton belts in the vicinity of planetary bodies. The inability to replace hardware failures on long-term space instrumentation, such as satellites, necessitates rigorous instrument design and component selection to ensure reliability during the mission timeline. Semiconductor circuits and devices, including complementary metal-oxide-semiconductor (CMOS) devices, are often part of systems and devices used in such harsh environments. However, semiconductors are prone to damage from radiation due to the nature of semiconductors, such as small band gap materials operating with limited numbers of charge carriers.

Radiation damage may include short term effects, which may be either temporary or permanent, or long term effects, which tend to be permanent. Total ionization damage involves impacts of high energy radiation resulting in the creation of electron-hole pairs. In materials with high electron and hole mobilities, electrons and holes may quickly re-combine or be swept away in the presence of electric fields. However, in some materials, such as some materials associated with semiconductor fabrication, the holes may become trapped, which may be problematic. A cumulative measure of the total incident ionizing radiation is the Total Ionizing Dose (TID). Ionizing radiation may impinge on oxides in a semiconductor device and generate electron-hole pairs in the oxides. Electrons tend to be very mobile in an oxide, while holes tend to be very immobile in an oxide, such that the holes may become trapped, which may result in a net positive charge. Mobility differences between electrons and holes in oxides may be several orders of magnitude. In a CMOS circuit, gate oxides may be thin enough so that both electrons and holes may tunnel out and not become trapped; however, isolation oxides are used to isolate areas from one another and must be thick enough to handle voltage differences between different areas. Therefore, holes may remain trapped in isolation oxides, such that ionizing radiation impinging on an isolation oxide may effectively implant a positive charge in the isolation oxide. Electric fields in a CMOS circuit may tend to drive the trapped holes in the isolation oxide down toward an interface between the isolation oxide and a semiconductor substrate, which may interfere with proper operation of the CMOS circuit. The TID may also manifest as increased oxide trapping and other defects.

FIG. 1 shows a three-dimensional view of a two-edge metal-oxide-semiconductor (MOS) transistor 10 formed using a semiconductor substrate 12, according to the prior art. The two-edge MOS transistor 10 includes a source 14, a drain 16, and a gate 18. The source 14 and the drain 16 may be formed in the semiconductor substrate 12 using ion implantation or other semiconductor fabrication techniques. A channel (not shown) is between the source 14 and the drain 16. Isolation oxide 20 surrounds the source 14, the drain 16, and the channel to isolate the two-edge MOS transistor 10 from adjacent devices (not shown). The isolation oxide 20 may be associated with shallow trench isolation (STI). Since the two-edge MOS transistor 10 is fabricated using the semiconductor substrate 12, the semiconductor substrate 12 may have a bulk connection (not shown) electrically connected to the body (not shown) of the two-edge MOS transistor 10. The gate 18 is located over and controls current flow through the channel. A thin layer of gate oxide (not shown) electrically isolates the gate 18 from the channel. The semiconductor substrate 12 may typically be Silicon and the gate 18 may be poly-Silicon, metal, silicide, or alloy that is compatible with semiconductor manufacturing.

The two-edge MOS transistor 10 may be either an N-type MOS (NMOS) transistor or a P-type MOS (PMOS) transistor. In an NMOS transistor, the source 14 and the drain 16 may be N-type semiconductor material, and the body may be P-type semiconductor material. In a PMOS transistor, the source 14 and the drain 16 may be P-type semiconductor material, and the body may be N-type semiconductor material. If the semiconductor substrate 12 is P-type semiconductor material, then the body of an NMOS transistor may be provided by the semiconductor substrate 12 and the body of a PMOS transistor may be provided by an N-well (not shown) in the semiconductor substrate 12. Similarly, if the semiconductor substrate 12 is N-type semiconductor material, then the body of a PMOS transistor may be provided by the semiconductor substrate 12 and the body of an NMOS transistor may be provided by a P-well (not shown) in the semiconductor substrate 12.

FIG. 2 shows three-dimensional details of the two-edge MOS transistor 10 illustrated in FIG. 1. The gate 18 has been omitted to show a channel 22 between the source 14 and the drain 16. The channel 22 has a first edge 24 and a second edge 26 next to the isolation oxide 20. The gate 18 may extend over the first and second edges 24, 26 and the isolation oxide 20, which may be necessary for metallization connections (not shown). In an NMOS transistor, when a voltage at the gate 18 is positive with respect to the source 14, the NMOS transistor may turn on, thereby passing current between the source 14 and the drain 16. Similarly, when the voltage at the gate 18 is equal to or negative with respect to the source 14, the NMOS transistor may turn off, thereby blocking current between the source 14 and the drain 16.

In a high radiation environment, ionizing radiation may impinge on the isolation oxide 20 over time, thereby creating trapped holes and resulting trapped positive charges in the isolation oxide 20. In an NMOS transistor, the trapped positive charges near the first and second edges 24, 26 may behave somewhat like a virtual gate, thereby causing leakage current between the source 14 and the drain 16, lowering a threshold voltage of the two-edge MOS transistor 10, or both. In a PMOS transistor, the trapped positive charges near the first and second edges 24, 26 may behave somewhat like the virtual gate; however, a positive voltage on a PMOS gate relative to a PMOS source further turns off the PMOS transistor. Therefore, the trapped positive charges in particular, and ionizing radiation in general, tend to not be problematic in PMOS devices.

FIG. 3 shows a two-dimensional cross section of a P-type semiconductor substrate 28, which is used to form a first NMOS transistor 30 adjacent to a second NMOS transistor 32. The first NMOS transistor 30 includes a first source 34, a first drain 36, a first gate 38, and first bulk connection material 40. The second NMOS transistor 32 includes a second source 42, a second drain 44, a second gate 46, and second bulk connection material 48. The first and second sources 34, 42 and the first and second drains 36, 44 include N-type semiconductor material. The first and second bulk connection materials 40, 48 may include highly-doped P-type semiconductor material. The first and second gates 38, 46 may include a conductive material, such as poly-Silicon, metal, silicide, or alloy. The first and second gates 38, 46 are electrically isolated from channels between the first source and drain 34, 36 and the second source and drain 42, 44 with a thin gate oxide layer 50.

The first and second NMOS transistors 30, 32 are isolated from each other by the isolation oxide 20; however, the first and second drains 36, 44, which are N-type semiconductor material, and the P-type semiconductor substrate 28 between the first and second drains 36, 44 under the isolation oxide 20 may form a virtual NMOS transistor 52. Even with a voltage difference between the first and second drains 36, 44, the virtual NMOS transistor 52 does not conduct current since there is no gate voltage to bias the virtual NMOS transistor 52 into a conducting state. However, over time in a high radiation environment, ionizing radiation may impinge on the isolation oxide 20, thereby creating trapped holes and resulting trapped positive charges in the isolation oxide 20. These trapped positive charges may function as a positively biased virtual gate for the virtual NMOS transistor 52, thereby causing leakage current to flow between the first and second NMOS transistors 30, 32. Thus, there is a need to reduce or eliminate the effects of ionizing radiation in two-edge NMOS transistors and in adjacent NMOS transistors.

SUMMARY OF THE EMBODIMENTS

The present invention relates to radiation hardening by design (RHBD), which employs layout and circuit techniques to mitigate the damaging effects of ionizing radiation. Reverse body biasing (RBB) of N-type metal-oxide-semiconductor (NMOS) transistors may be used to counteract the effects of trapped positive charges in isolation oxides due to ionizing radiation. In a traditional MOS integrated circuit, input/output (I/O) circuitry may be powered using an I/O power supply voltage, and core circuitry may be powered using a core power supply voltage, which is between the I/O power supply voltage and ground. However, in one embodiment of the present invention, the core circuitry is powered using a voltage difference between the core power supply voltage and the I/O power supply voltage. The bodies of NMOS transistors in the core circuitry are coupled to ground; therefore, a voltage difference between the core power supply voltage and ground provides RBB, and radiation hardens the core circuitry.

In an alternate embodiment of the present invention, the bodies of NMOS transistors in a radiation hardened MOS circuit are isolated from a substrate using a multiple-well architecture. The radiation hardened MOS circuit may be powered conventionally; however, the bodies of the NMOS transistors are coupled to a negative power supply voltage, which provides RBB. Since the bodies of the NMOS transistors are isolated using the multiple-well architecture, the negative power supply voltage does not impact adjacent devices. In another embodiment of the present invention, alternate NMOS layouts may be used to redress the radiation weaknesses of two-edge NMOS transistors.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 8C:
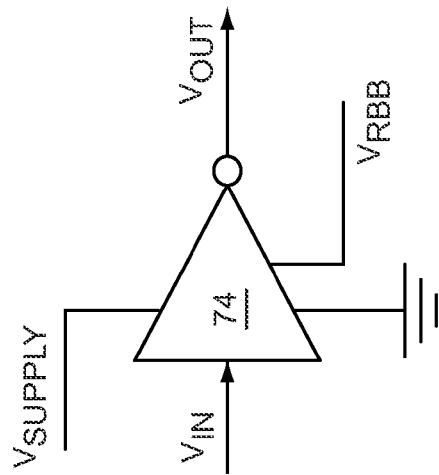
Figure 8B:
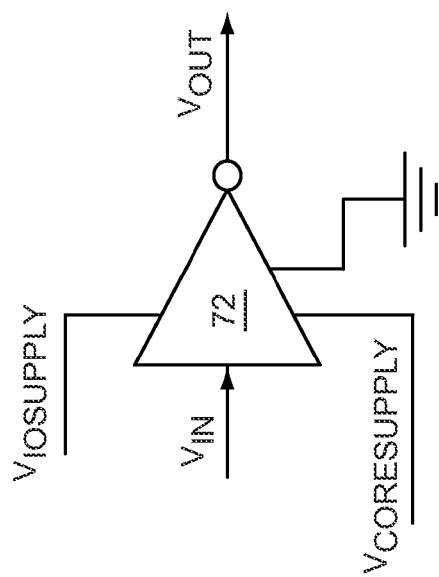
Figure 8A:
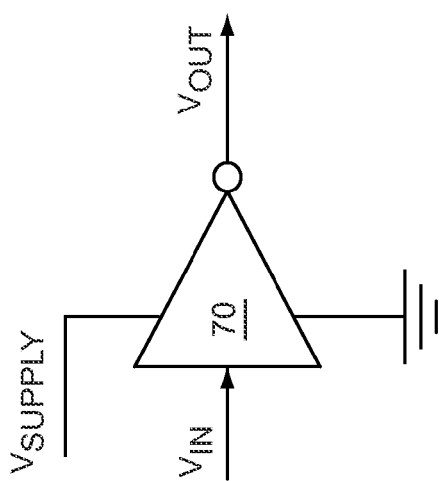

FIGS. 8A, 8B, and 8C show a traditional complementary metal-oxide-semiconductor (CMOS) inverter, a reverse body biasing (RBB) CMOS inverter, and an isolation well RBB CMOS inverter, respectively.

FIGS. 9A, 9B, and 9C show details of the traditional CMOS inverter, the RBB CMOS inverter, and the isolation well RBB CMOS inverter, respectively.

Figure 10:
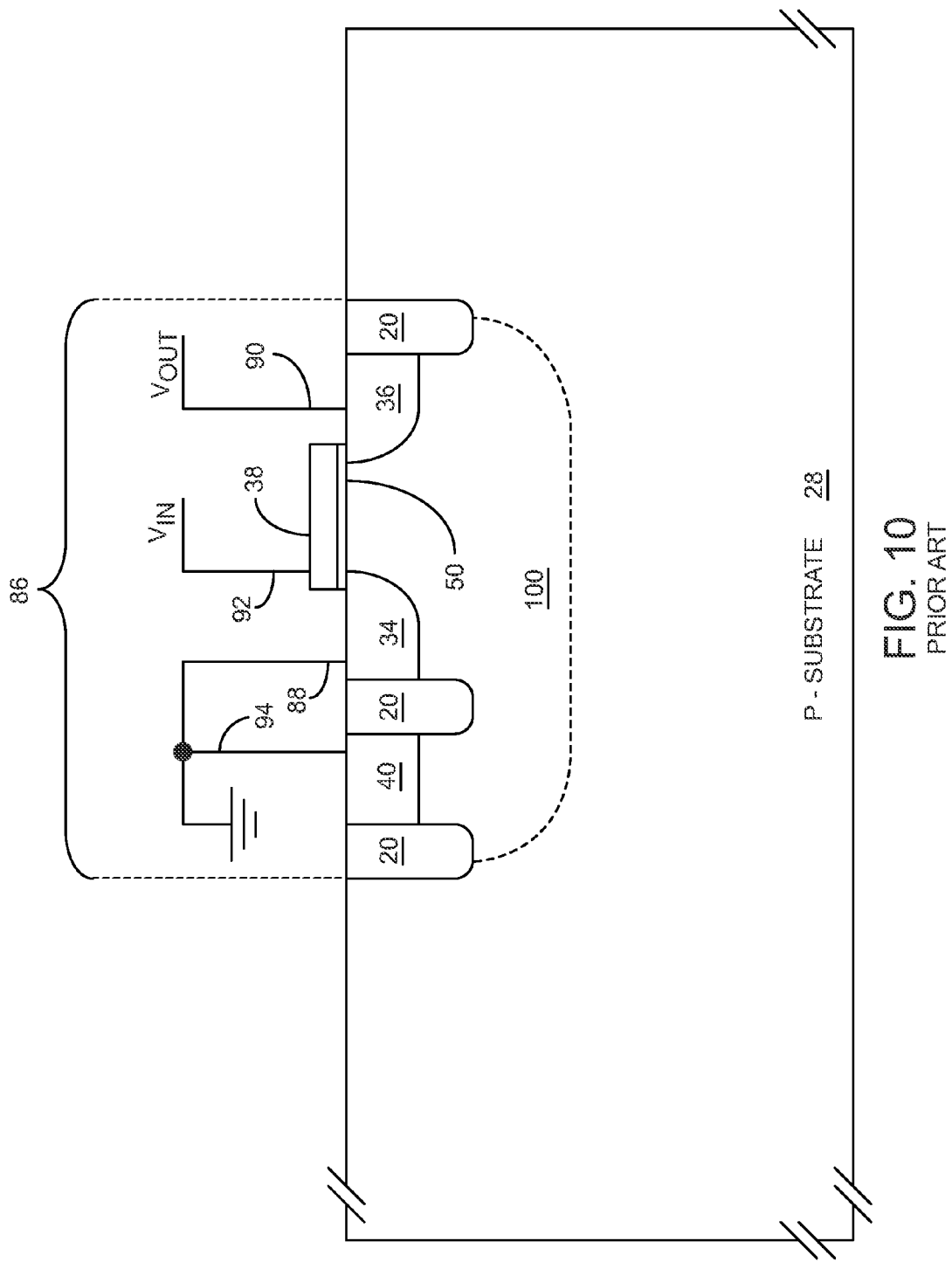

FIG. 10 shows details of a traditional NMOS transistor illustrated in FIG. 9A.

Figure 11:
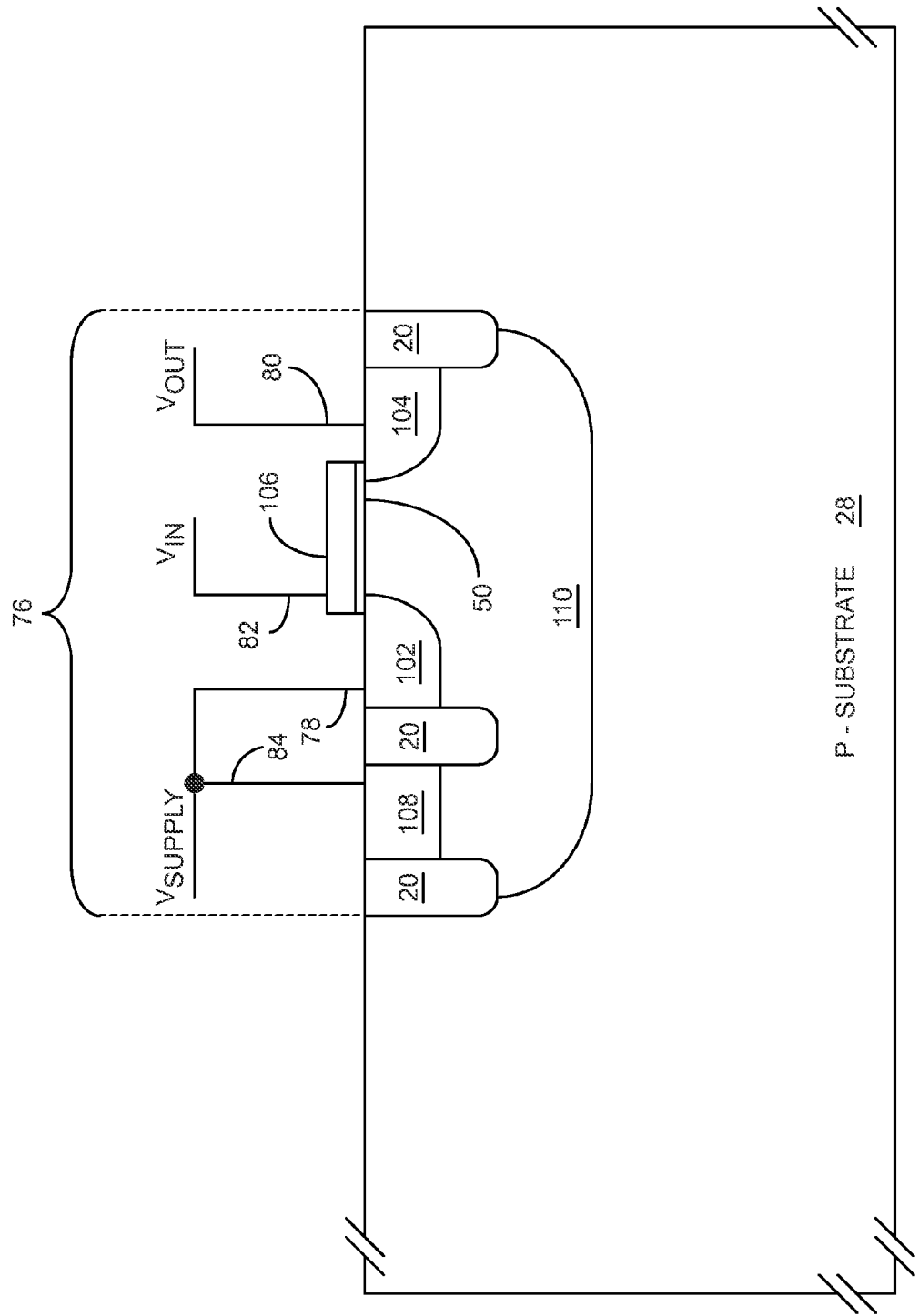

FIG. 11 shows details of a traditional PMOS transistor illustrated in FIG. 9A.

Figure 12:
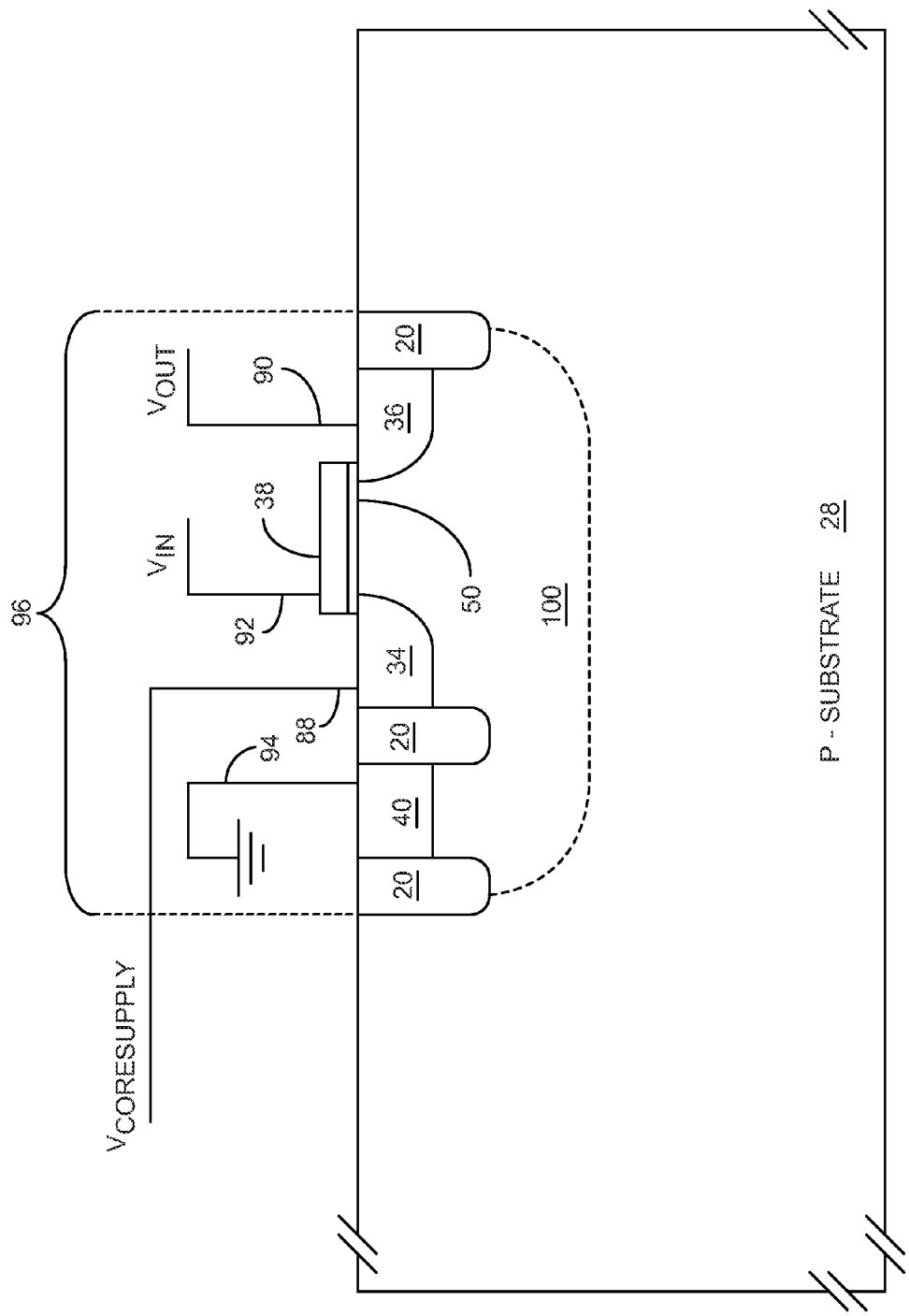

FIG. 12 shows details of an RBB NMOS transistor illustrated in FIG. 9B.

Figure 13:
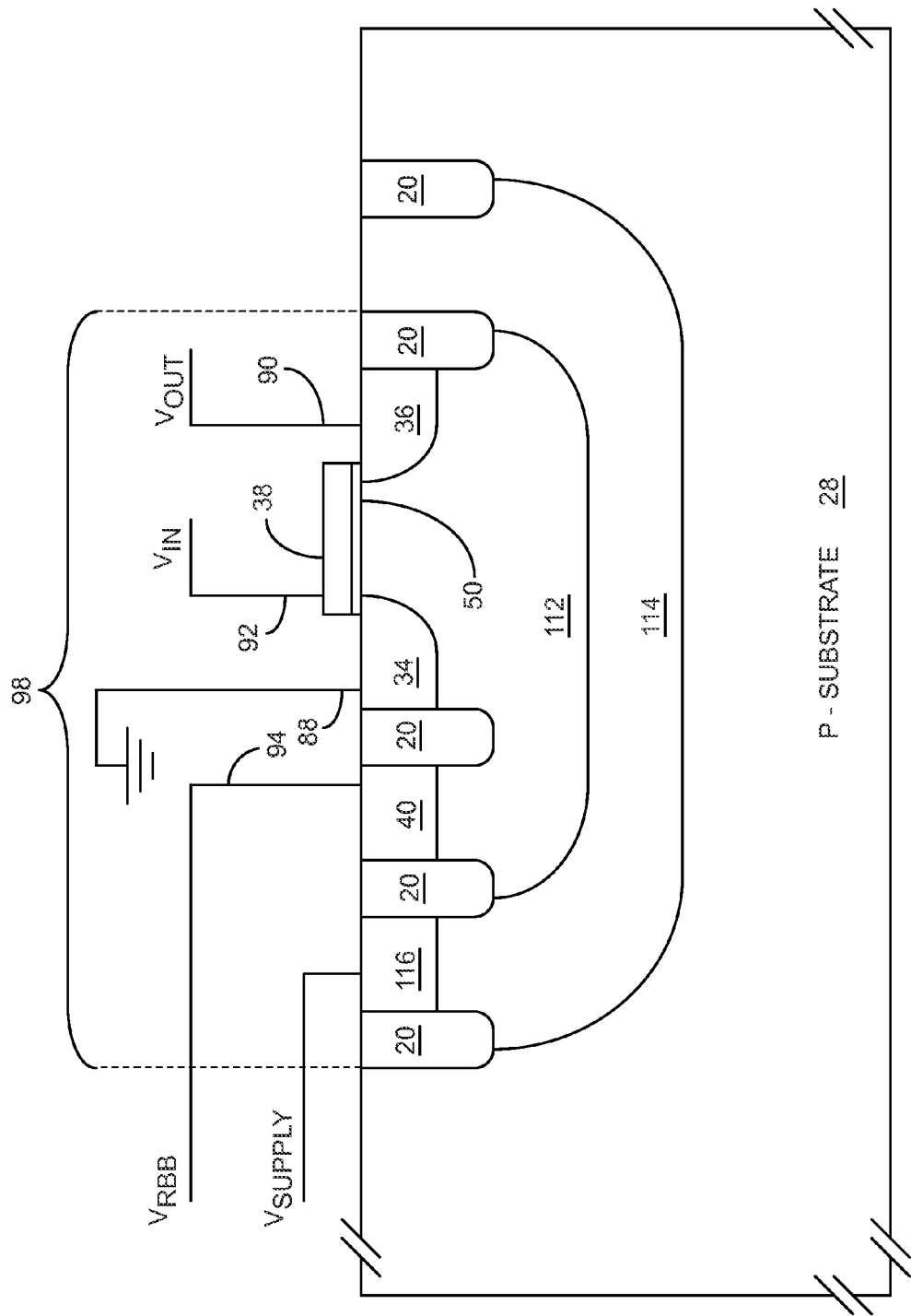

FIG. 13 shows details of an isolation well RBB NMOS transistor illustrated in FIG. 9C.

Figure 14:
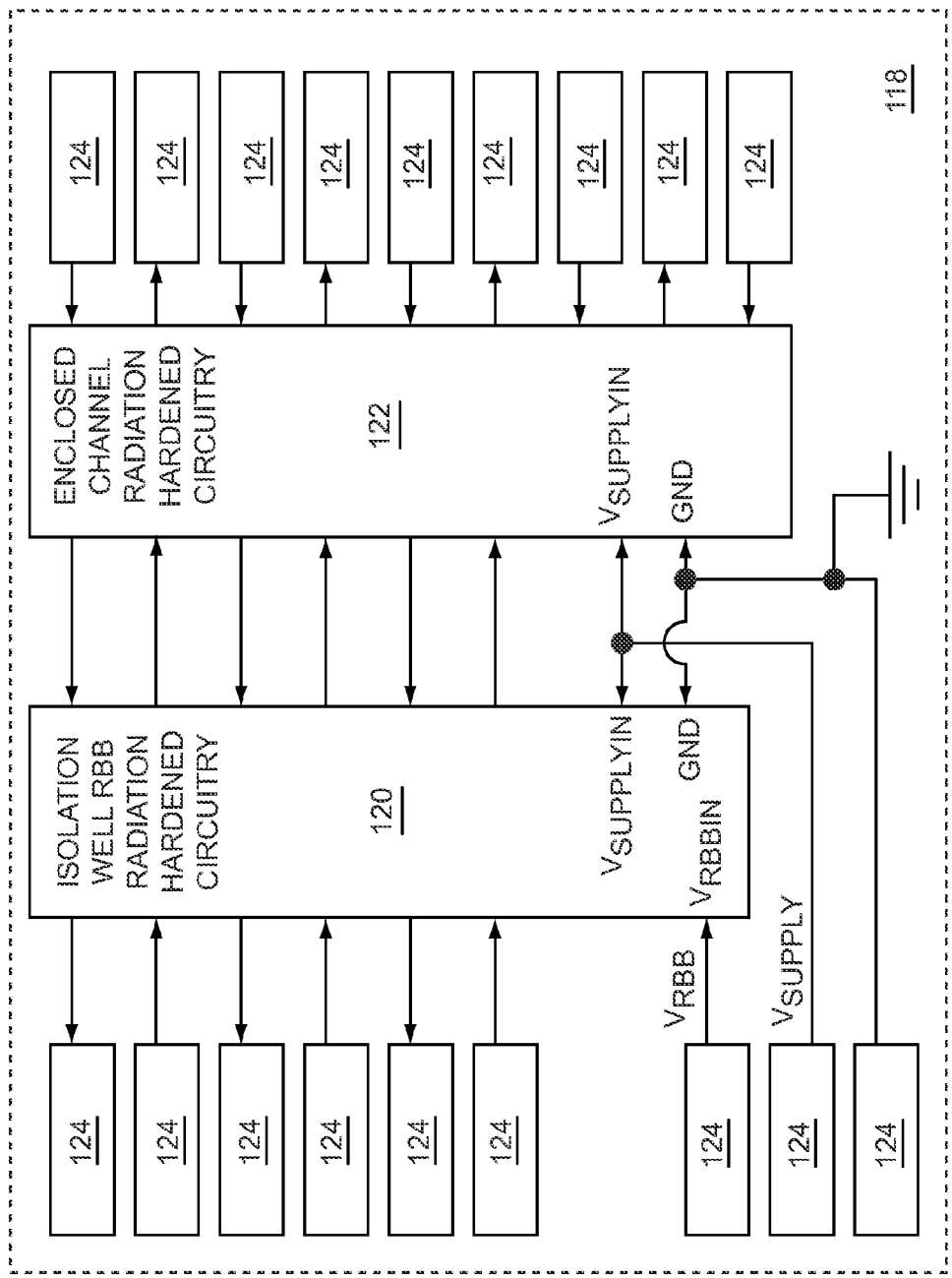

FIG. 14 shows an integrated circuit (IC) providing isolation well RBB radiation hardened circuitry and enclosed channel radiation hardened circuitry, according to one embodiment of the present invention.

Figure 15:
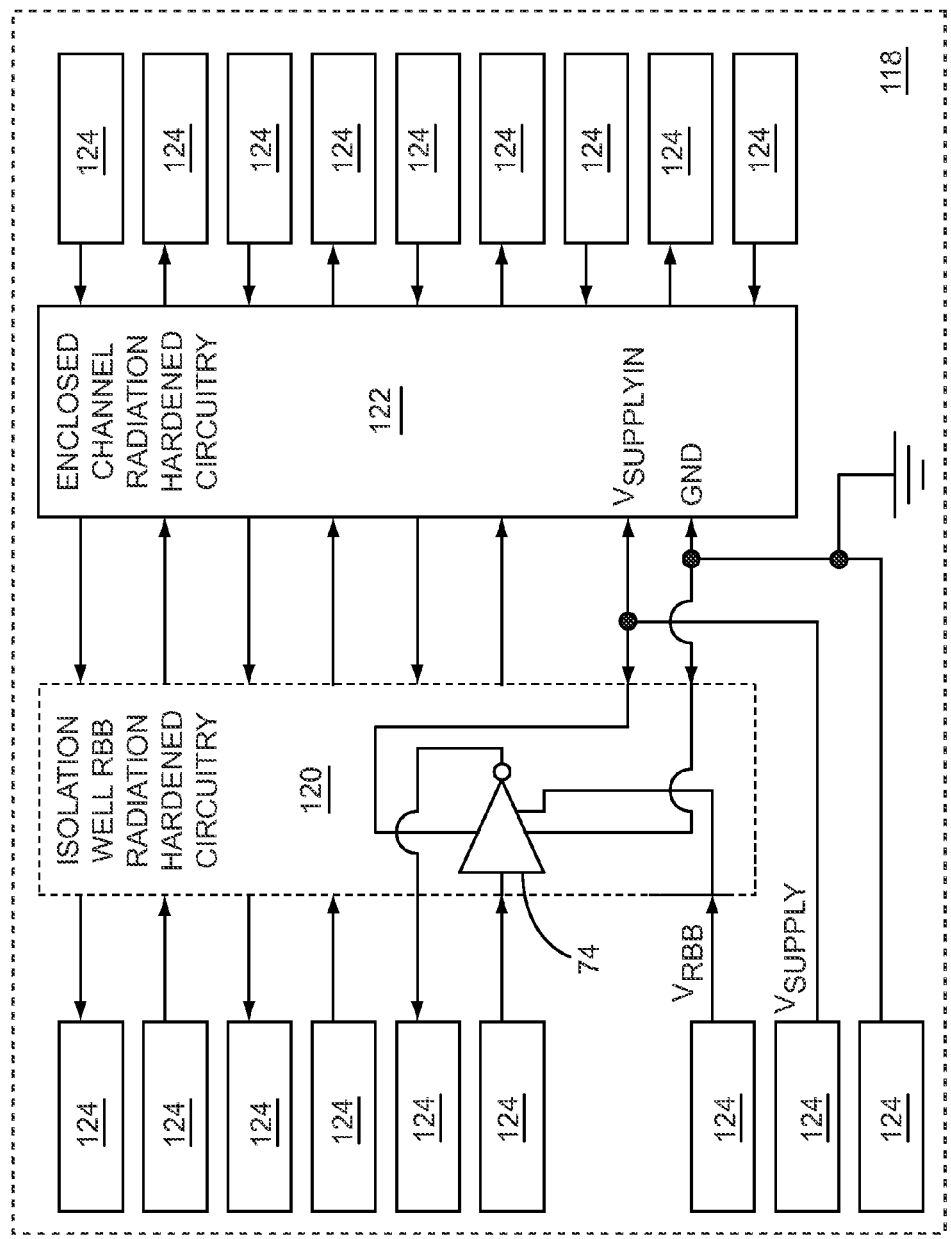

FIG. 15 shows details of the isolation well RBB radiation hardened circuitry illustrated in FIG. 14.

Figure 16:
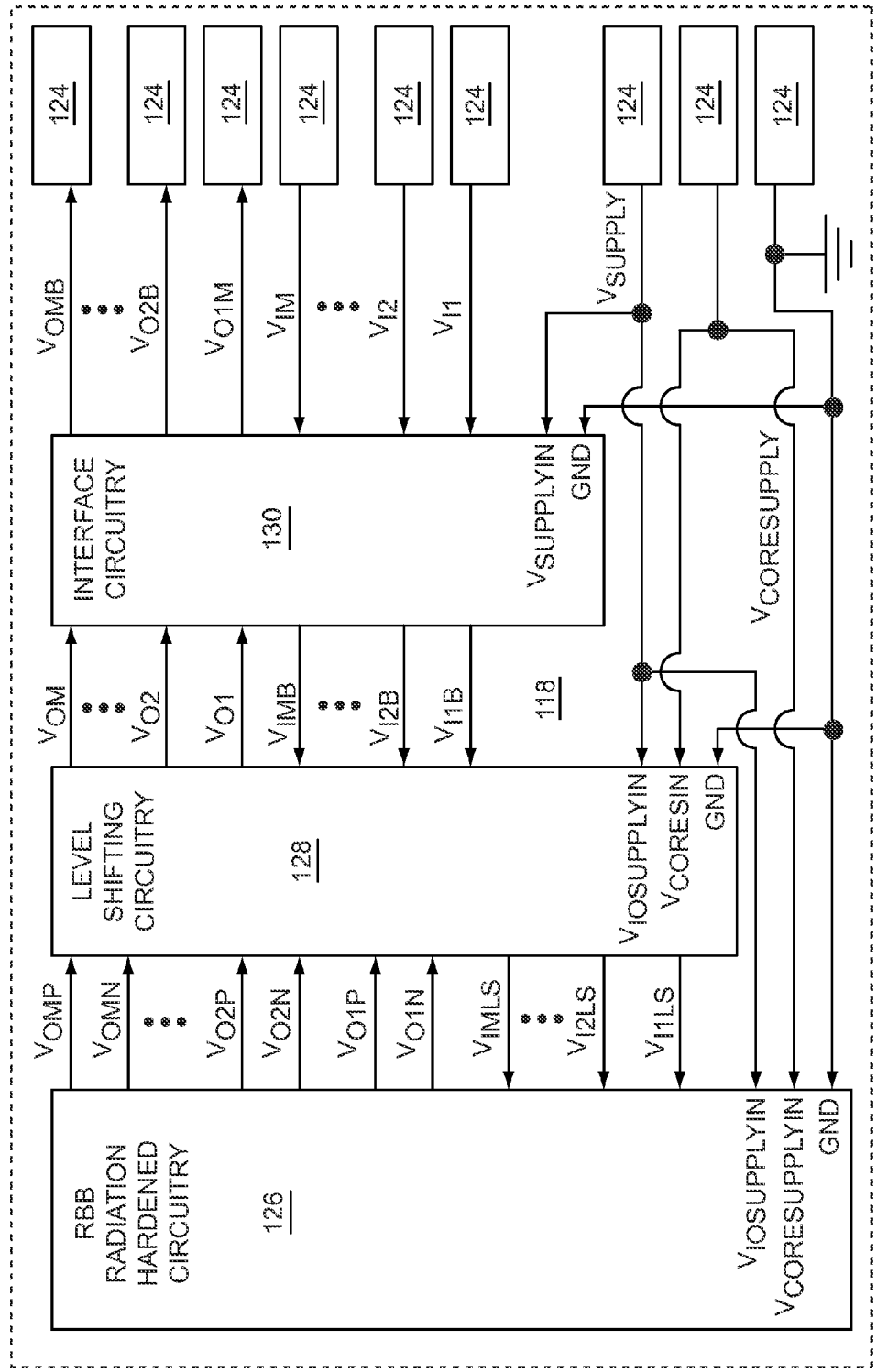

FIG. 16 shows the IC providing RBB radiation hardened circuitry, level shifting circuitry, and interface circuitry, according to an alternate embodiment of the present invention.

Figure 17:
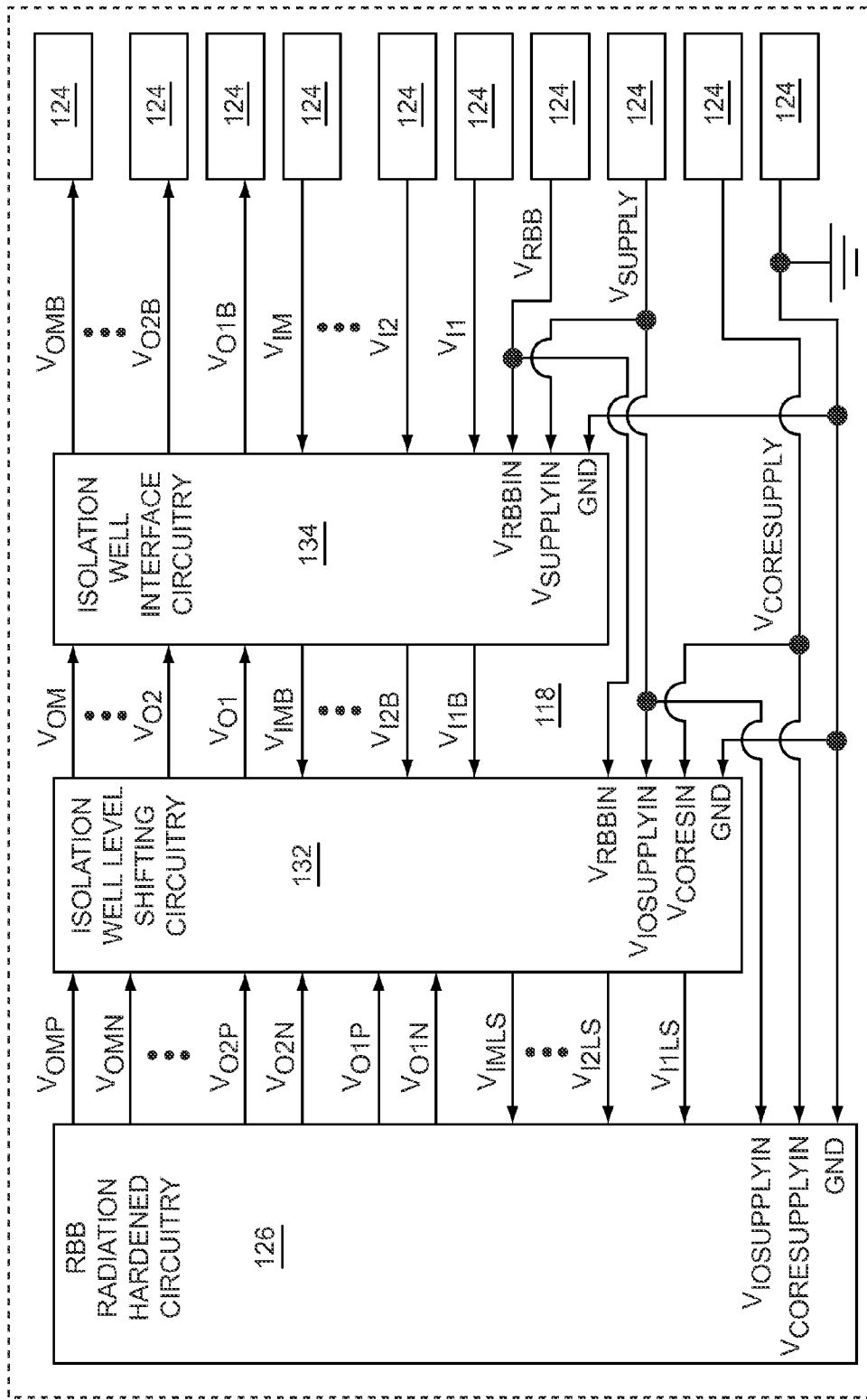

FIG. 17 shows the IC providing the RBB radiation hardened circuitry, isolation well level shifting circuitry, and isolation well interface circuitry, according to an additional embodiment of the present invention.

FIG. 18A shows details of the level shifting circuitry and the interface circuitry illustrated in FIG. 16.

FIG. 18B shows details of the isolation well level shifting circuitry and the isolation well interface circuitry illustrated in FIG. 17.

Figure 19:
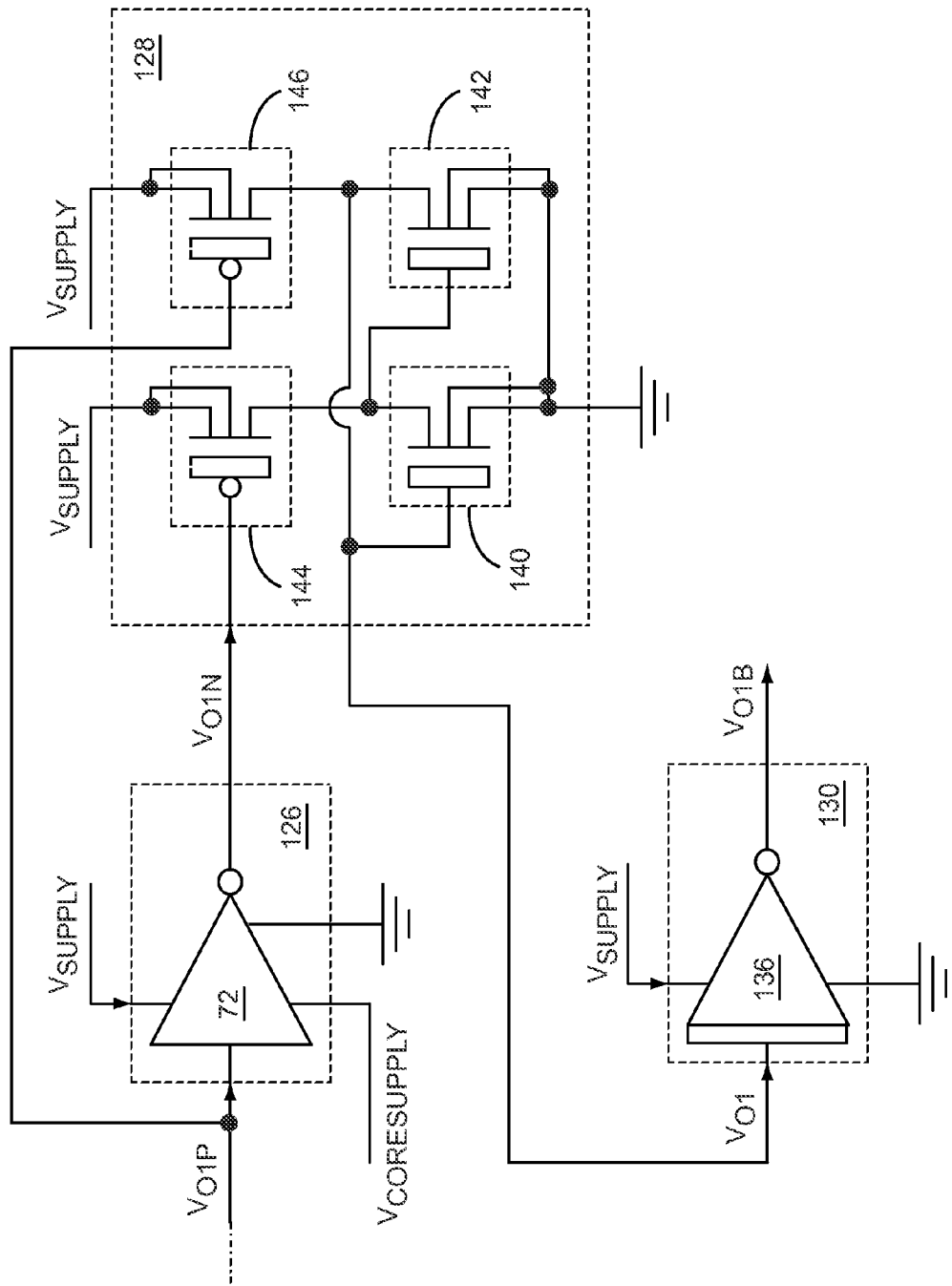

FIG. 19 shows additional details of the RBB radiation hardened circuitry, the level shifting circuitry, and the interface circuitry illustrated in FIG. 16.

Figure 20:
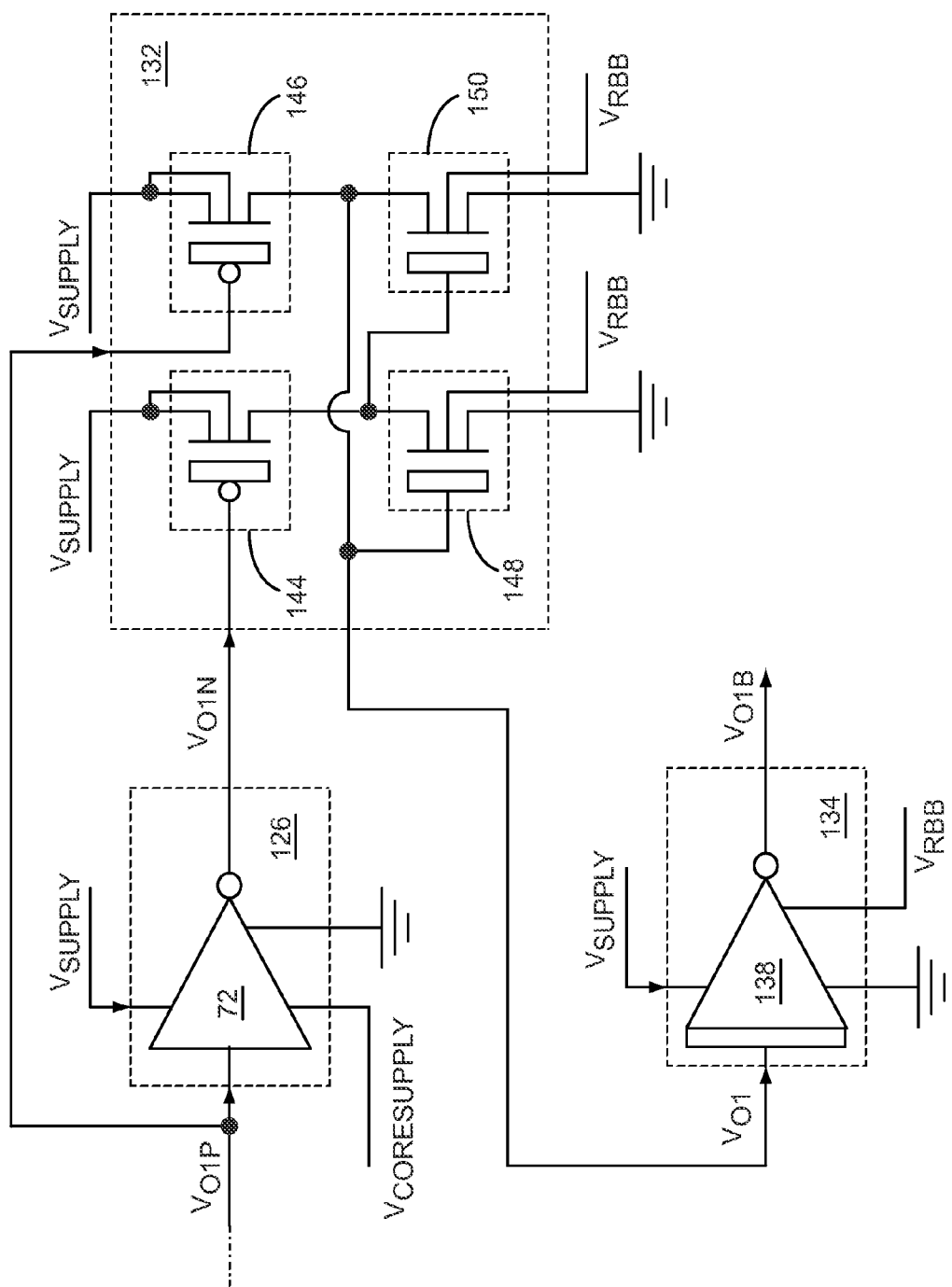

FIG. 20 shows additional details of the RBB radiation hardened circuitry, the isolation well level shifting circuitry, and the isolation well interface circuitry illustrated in FIG. 17.

Figure 21:
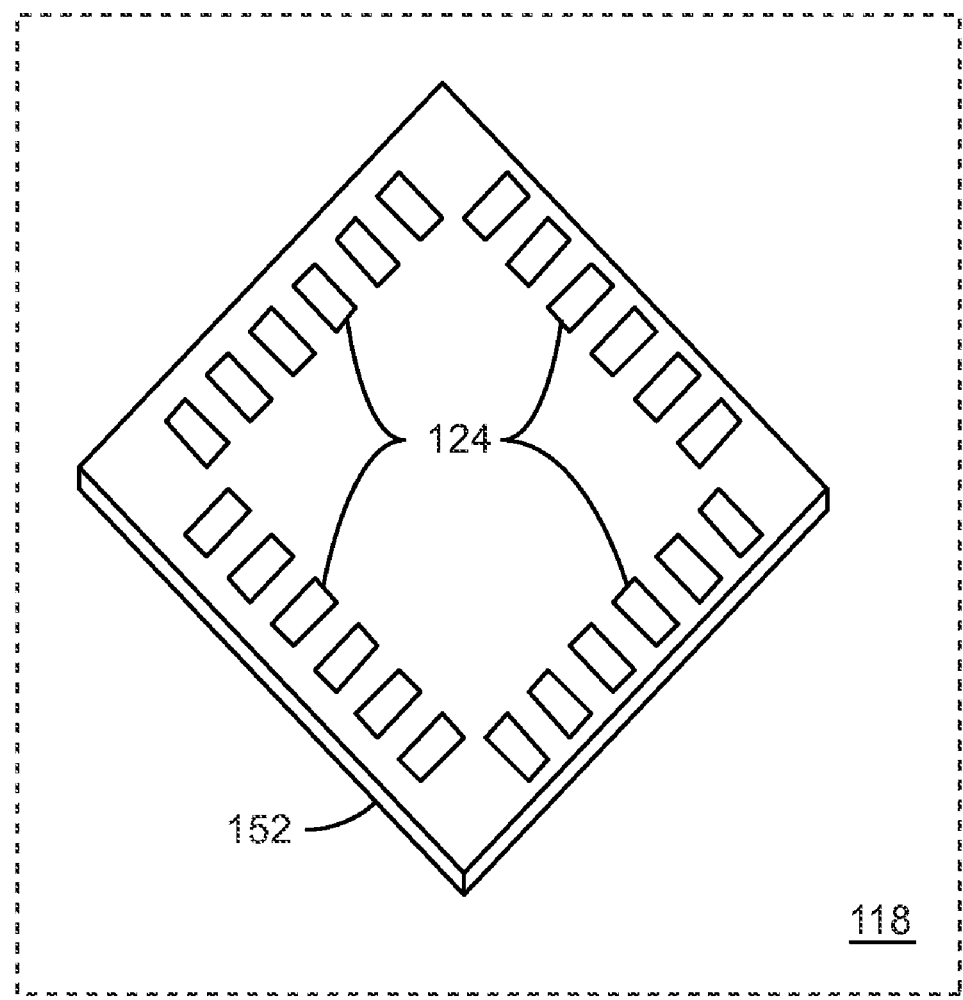

FIG. 21 shows details of the IC, according to one embodiment of the present invention.

FIG. 22 shows details of the IC, according to an alternate embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to radiation hardening by design (RHBD), which employs layout and circuit techniques to mitigate the damaging effects of a Total Ionizing Dose (TID) of ionizing radiation. As previously discussed, a two-edge N-type metal-oxide-semiconductor (NMOS) transistor is particularly vulnerable to trapped positive charges in an isolation oxide that is adjacent to channel edges of the two-edge NMOS transistor. Alternate NMOS layouts may be used to redress the radiation weaknesses of two-edge NMOS transistors. In one embodiment of the present invention, an enclosed channel NMOS transistor may be used as a radiation hardened replacement for the two-edge NMOS transistor. In general, an enclosed channel NMOS transistor separates the channel from the isolation oxide, thereby minimizing any gate-like influences of trapped positive charges in the isolation oxide upon the channel. For example, an enclosed source may be surrounded by an enclosed channel, which is surrounded by a drain, which is surrounded by the isolation oxide. The drain separates the channel from the isolation oxide.

Figure 1:
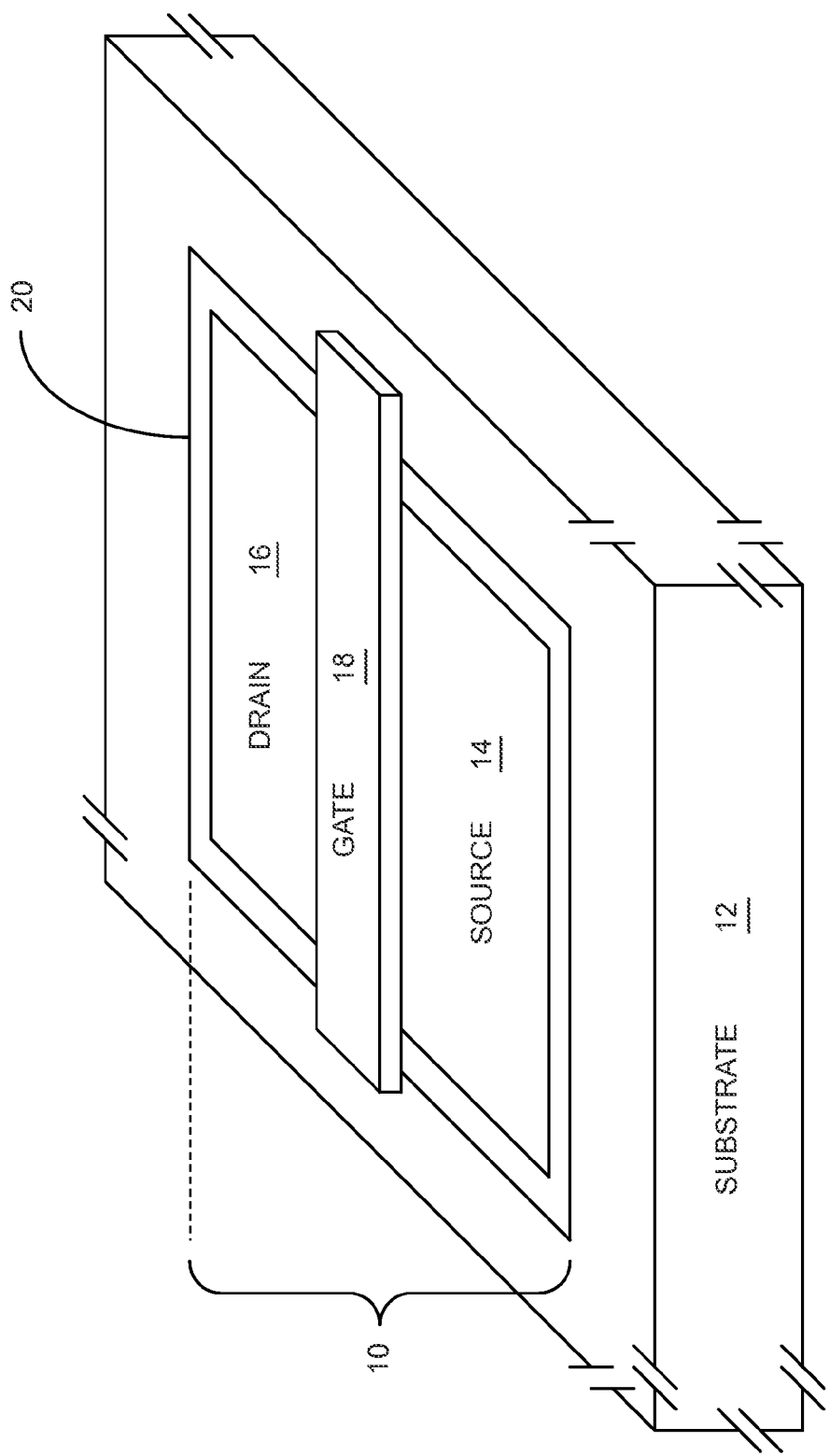
FIG. 1 shows a three-dimensional view of a two-edge metal-oxide-semiconductor (MOS) transistor formed using a semiconductor substrate, according to the prior art.
Figure 2:
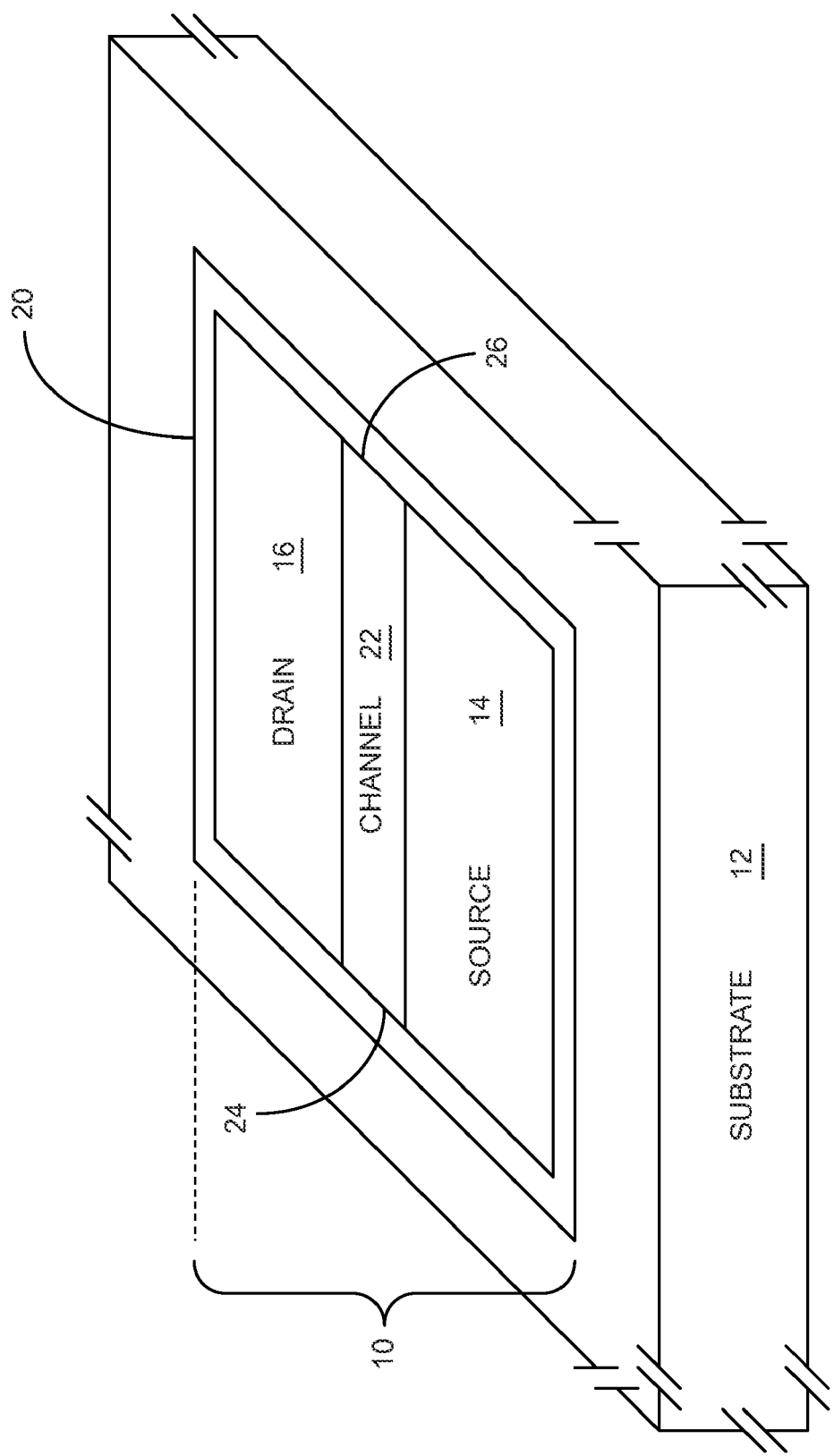
FIG. 2 shows three-dimensional details of the two-edge MOS transistor illustrated in FIG. 1.
Figure 3:
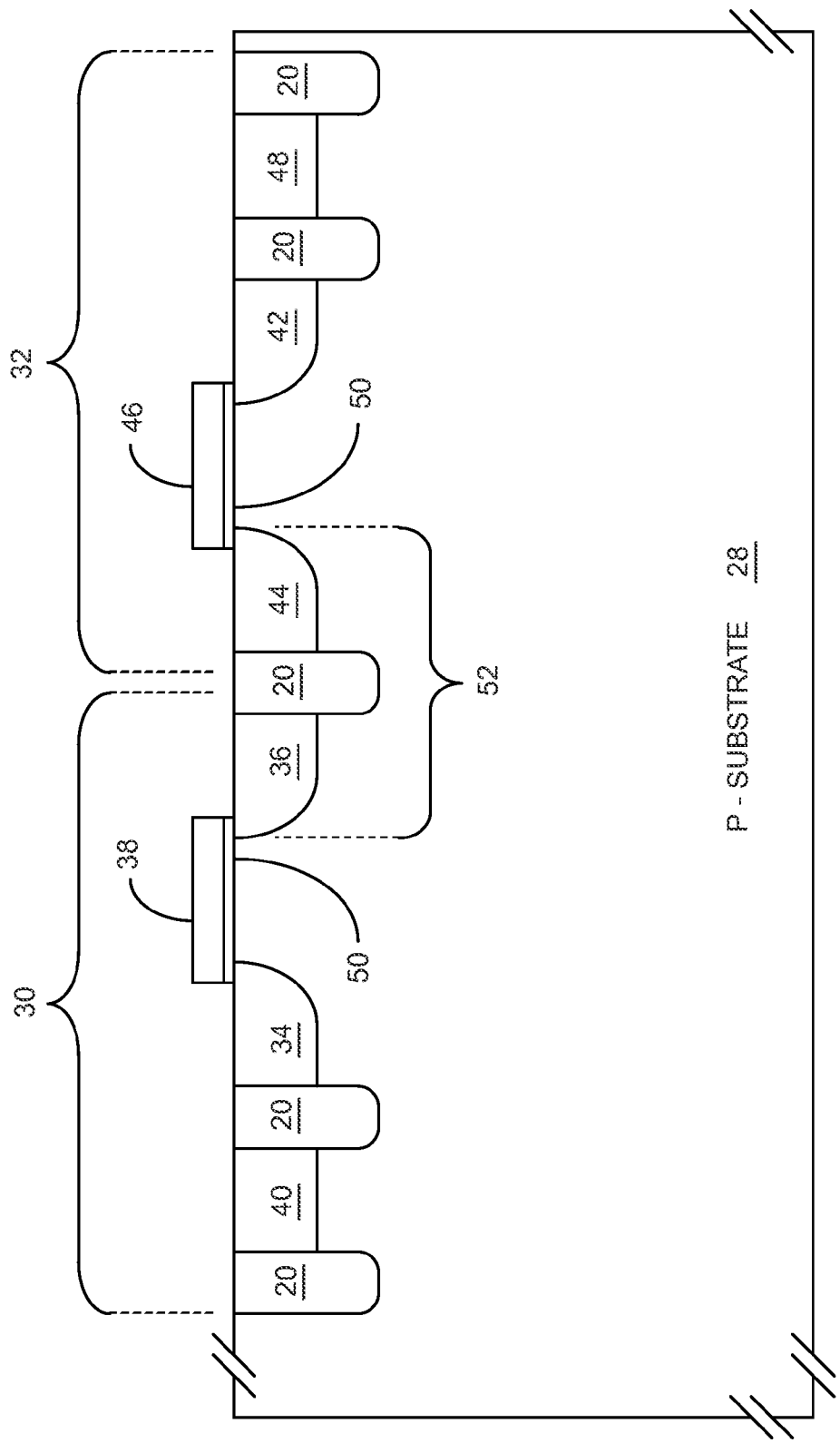
FIG. 3 shows a two-dimensional cross section of a P-type semiconductor substrate, which is used to form a first N-type MOS (NMOS) transistor adjacent to a second NMOS transistor, according to the prior art.
Figure 4:
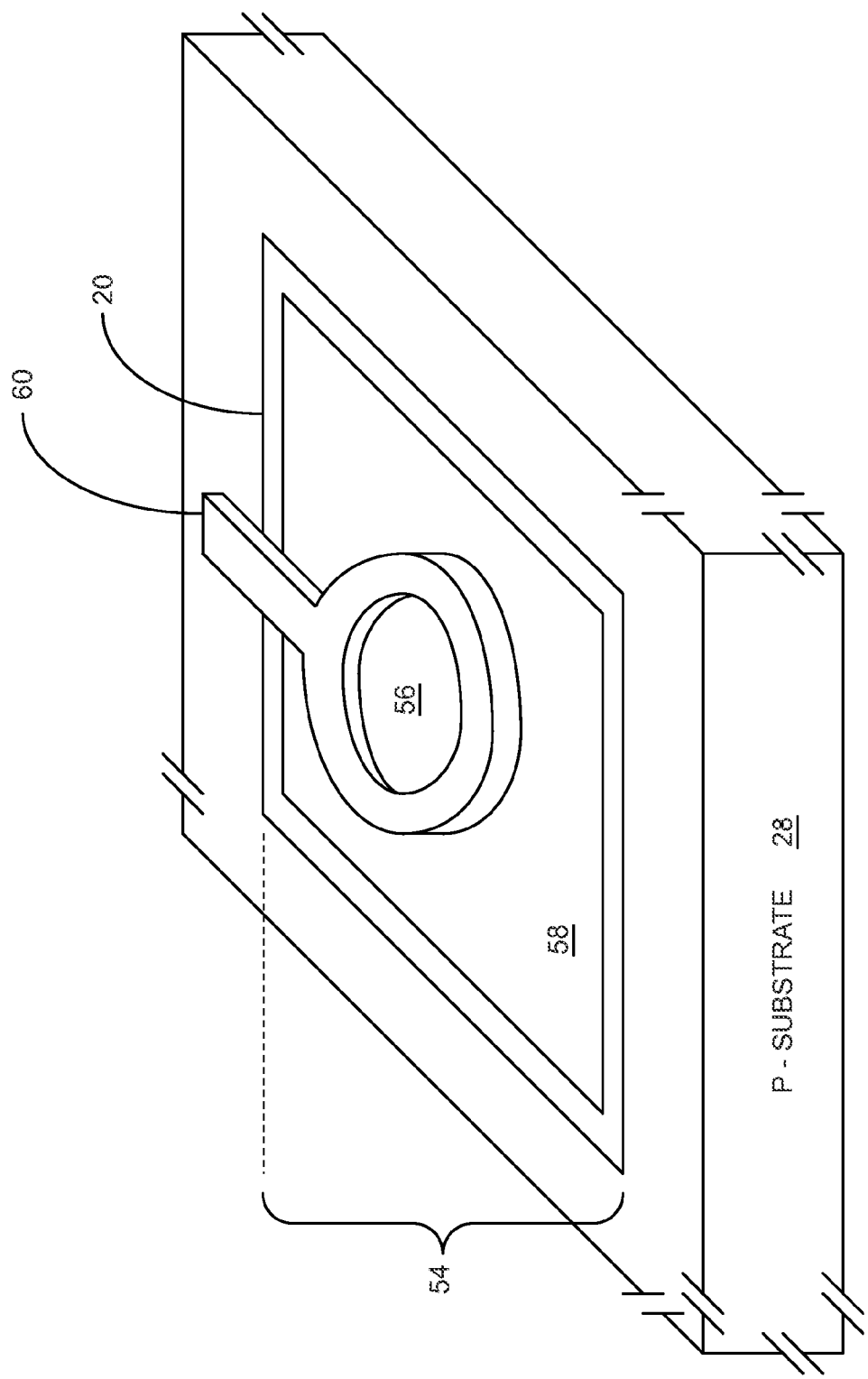
FIG. 4 shows a three-dimensional view of an enclosed source NMOS transistor, according to one embodiment of the present invention.

FIG. 4 shows a three-dimensional view of an enclosed source NMOS transistor 54, according to one embodiment of the present invention. The enclosed source NMOS transistor 54 includes an enclosed source 56, a non-enclosed drain 58, and an enclosed gate 60. The enclosed source 56 and the non-enclosed drain 58 include N-type semiconductor material and may be formed in the P-type semiconductor substrate 28 using ion implantation or other semiconductor fabrication techniques. An enclosed channel (not shown) surrounds the enclosed source 56 and the non-enclosed drain 58 surrounds the enclosed channel. The isolation oxide 20 surrounds the non-enclosed drain 58 to isolate the enclosed source NMOS transistor 54 from adjacent devices (not shown). The isolation oxide 20 may be associated with shallow trench isolation (STI). Since the enclosed source NMOS transistor 54 is fabricated using the P-type semiconductor substrate 28, the P-type semiconductor substrate 28 may have a bulk connection (not shown) electrically connected to the body (not shown) of the enclosed source NMOS transistor 54.

Figure 5:
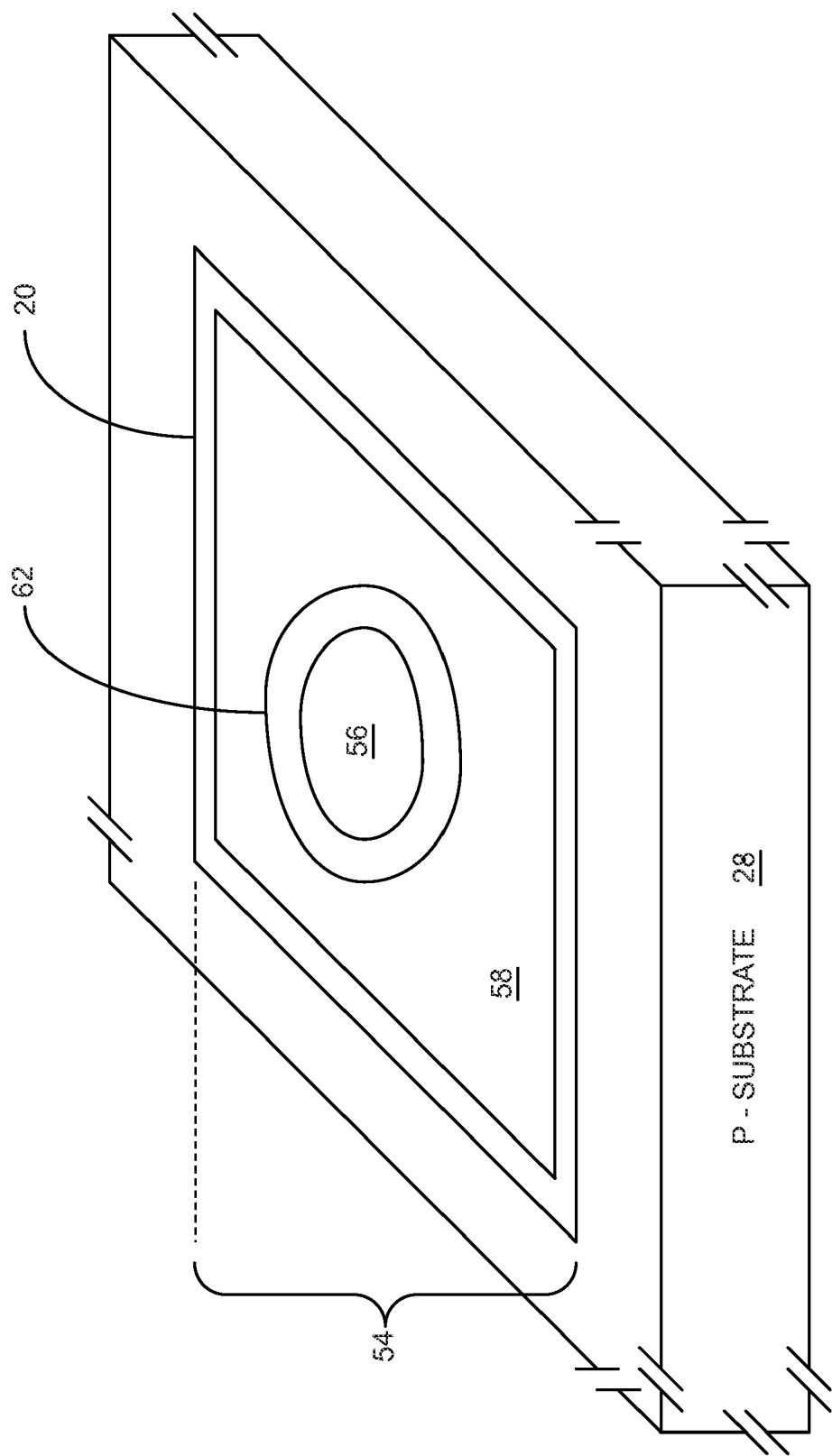
FIG. 5 shows three-dimensional details of the enclosed source NMOS transistor illustrated in FIG. 4.

The enclosed gate 60 is located over and controls current flow through the enclosed channel. A thin layer of gate oxide (not shown) electrically isolates the enclosed gate 60 from the enclosed channel. The P-type semiconductor substrate 28 may typically be Silicon and the enclosed gate 60 may typically be poly-Silicon. The enclosed gate 60 may extend over the non-enclosed drain 58 and the isolation oxide 20, which may be necessary for metallization connections (not shown). However, since where the enclosed gate 60 crosses over the isolation oxide 20 is not adjacent to the enclosed channel, trapped positive charges in the isolation oxide 20 may not be problematic. The enclosed source 56 may be circular shaped as shown; however, alternate embodiments of the present invention may use enclosed sources 56 of other shapes. Similarly, the enclosed gate 60 may be annular ring shaped as shown; however, alternate embodiments of the present invention may use enclosed gates 60 of other shapes. FIG. 5 shows three-dimensional details of the enclosed source NMOS transistor 54 illustrated in FIG. 4. The enclosed gate 60 has been omitted to show an enclosed channel 62 between the enclosed source 56 and the non-enclosed drain 58.

Figure 6:
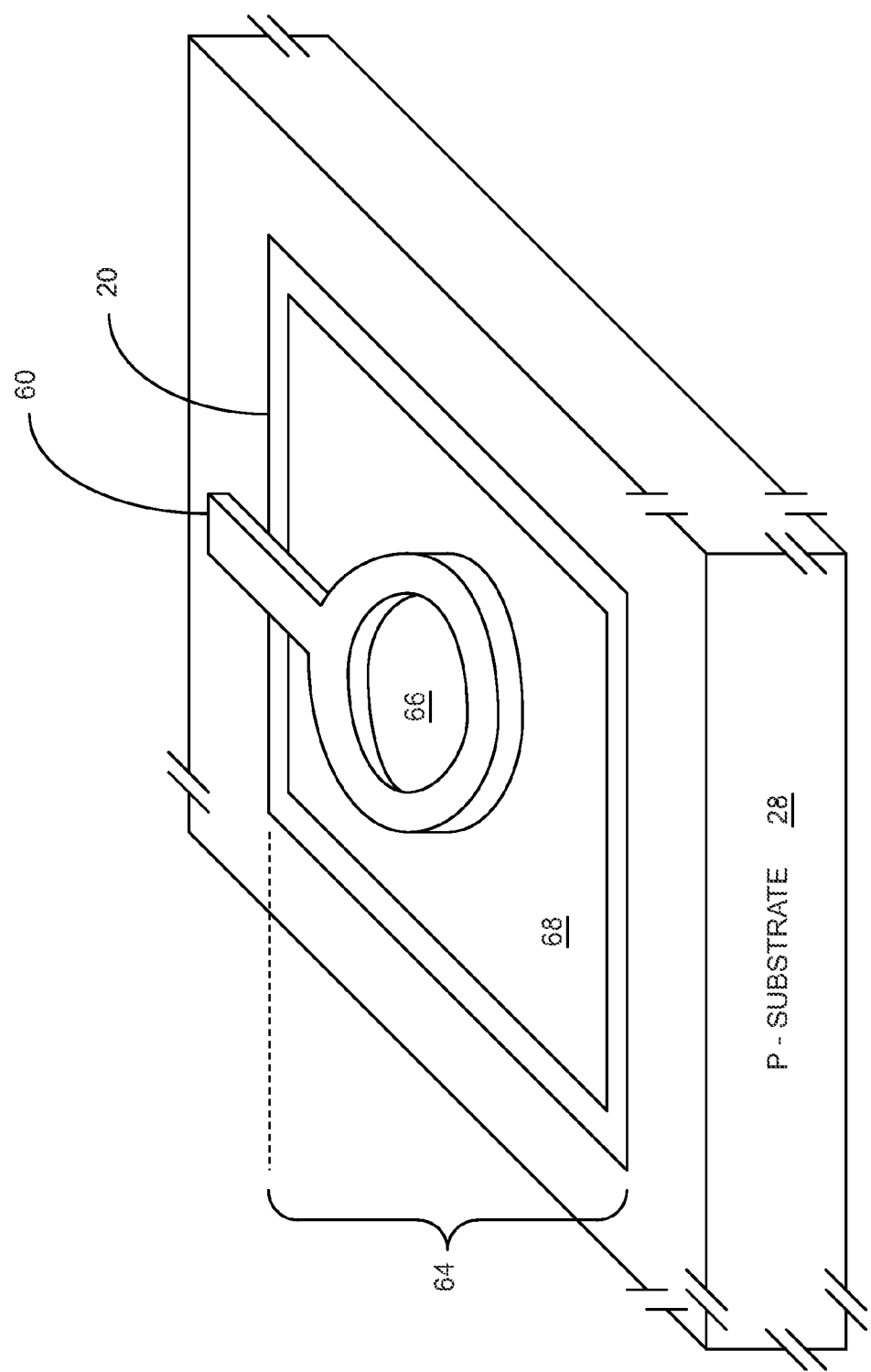
FIG. 6 shows a three-dimensional view of an enclosed drain NMOS transistor, according to one embodiment of the present invention.
Figure 7:
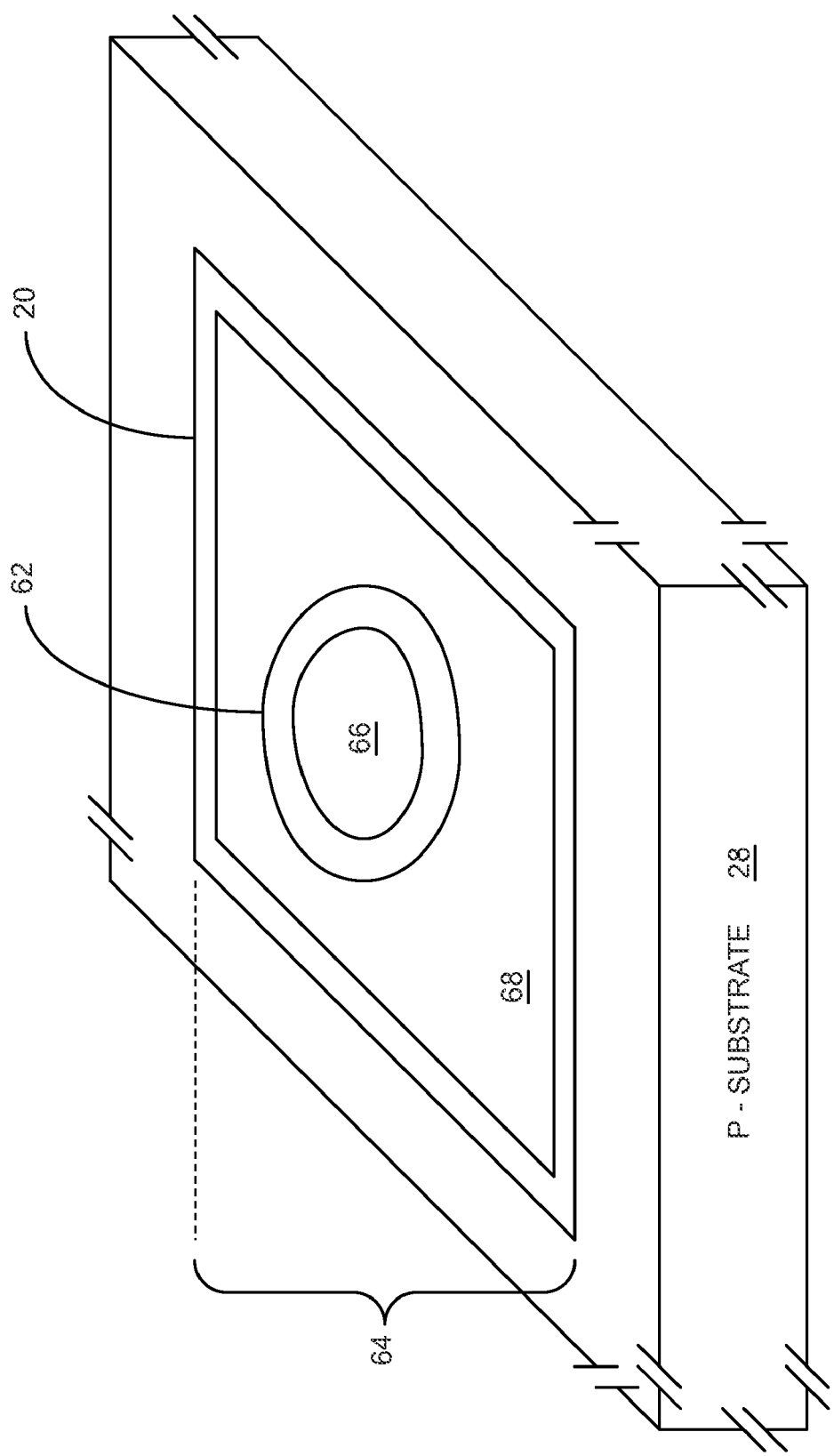
FIG. 7 shows three-dimensional details of the enclosed drain NMOS transistor illustrated in FIG. 6.

FIG. 6 shows a three-dimensional view of an enclosed drain NMOS transistor 64, according to one embodiment of the present invention. The enclosed drain NMOS transistor 64 includes an enclosed drain 66, a non-enclosed source 68, and the enclosed gate 60. The enclosed drain 66 and the non-enclosed source 68 include N-type semiconductor material and may be formed in the P-type semiconductor substrate 28 using ion implantation or other semiconductor fabrication techniques. Referring to FIG. 7, the enclosed channel 62 surrounds the enclosed drain 66 and the non-enclosed source 68 surrounds the enclosed channel 62. The isolation oxide 20 surrounds the non-enclosed source 68 to isolate the enclosed drain NMOS transistor 64 from adjacent devices (not shown). The isolation oxide 20 may be associated with STI. Since the enclosed drain NMOS transistor 64 is fabricated using the P-type semiconductor substrate 28, the P-type semiconductor substrate 28 may have a bulk connection (not shown) electrically connected to the body (not shown) of the enclosed drain NMOS transistor 64.

The enclosed gate 60 is located over and controls current flow through the enclosed channel 62. A thin layer of gate oxide (not shown) electrically isolates the enclosed gate 60 from the enclosed channel 62. The semiconductor P-type semiconductor substrate 28 may typically be Silicon and the enclosed gate 60 may typically be poly-Silicon. The enclosed gate 60 may extend over the non-enclosed source 68 and the isolation oxide 20, which may be necessary for metallization connections (not shown). However, since where the enclosed gate 60 crosses over the isolation oxide 20 is not adjacent to the enclosed channel 62, trapped positive charges in the isolation oxide 20 may not be problematic. The enclosed drain 66 may be circular shaped as shown; however, alternate embodiments of the present invention may use enclosed drains 66 of other shapes. Similarly, the enclosed gate 60 may be annular ring shaped as shown; however, alternate embodiments of the present invention may use enclosed gates 60 of other shapes. FIG. 7 shows three-dimensional details of the enclosed drain NMOS transistor 64 illustrated in FIG. 6. The enclosed gate 60 has been omitted to show the enclosed channel 62 between the enclosed drain 66 and the non-enclosed source 68.

Since gates in two-edge NMOS transistors may be shaped as a straight-line and since gates in enclosed channel NMOS transistors tend to form a loop of some shape, enclosed channel NMOS transistors tend to occupy larger layouts than two-edge NMOS transistors. Additionally, as modern semiconductor fabrication techniques evolve, circuit geometries continue to shrink. Line widths of 65 nanometers and 45 nanometers are being commercialized, which may be followed with line widths of 32 nanometers and 22 nanometers. One limitation of the smaller geometries may be that, in order to take advantage of the smallest line widths, the gates must be straight-line gates. Gates of other shapes may mandate larger line widths, thereby exacerbating the layout space penalty associated with using enclosed channel NMOS transistors instead of two-edge NMOS transistors. In high-density circuits, such as memory circuits or gate arrays, the layout space differences may be more problematic. Additionally, longer channel transistors have reduced drive current and increased capacitive loading on previous stages and therefore reduce circuit performance and increase power dissipation. Thus, other radiation hardening techniques are needed.

Reverse body biasing (RBB) of NMOS transistors is one RHBD technique that may be used to counteract the effects of trapped positive charges in isolation oxides due to ionizing radiation. In a traditional metal-oxide-semiconductor (MOS) integrated circuit, input/output (I/O) circuitry may be powered using an I/O power supply voltage, and core circuitry may be powered using a core power supply voltage, which is between the I/O power supply voltage and ground. However, in one embodiment of the present invention, the core circuitry is powered using a voltage difference between the core power supply voltage and the I/O power supply voltage. The bodies of NMOS transistors in the core circuitry are coupled to ground; therefore, a voltage difference between the core power supply voltage and ground provides RBB, and radiation hardens the core circuitry.

In an alternate embodiment of the present invention, the bodies of NMOS transistors in a radiation hardened MOS circuit are isolated from a substrate using a multiple-well architecture. The radiation hardened MOS circuit may be powered conventionally; however, the bodies of the NMOS transistors are coupled to a negative power supply voltage, which provides RBB. Since the bodies of the NMOS transistors are isolated using the multiple-well architecture, the negative power supply voltage does not impact adjacent devices.

FIGS. 8A, 8B, and 8C show a traditional complementary metal-oxide-semiconductor (CMOS) inverter 70, an RBB CMOS inverter 72, and an isolation well RBB CMOS inverter 74, respectively. The traditional CMOS inverter 70 receives operating power from a direct current (DC) power supply having a DC supply voltage $V_{SUPPLY}$ and ground having about zero voltage or ground voltage, according to the prior art. The traditional CMOS inverter 70 receives an input signal $V_{IN}$ and provides an output signal $V_{OUT}$, which is the logical complement of the input signal $V_{IN}$. In one embodiment of the present invention, the RBB CMOS inverter 72 receives operating power from an I/O DC power supply having an I/O DC supply voltage $V_{IOSUPPLY}$ and a core DC power supply having a core DC supply voltage $V_{CORESUPPLY}$. The I/O DC supply voltage $V_{IOSUPPLY}$ is positive relative to ground and the core DC supply voltage $V_{CORESUPPLY}$ is positive with a magnitude between the I/O DC supply voltage $V_{IOSUPPLY}$ and ground, which provides RBB for the RBB CMOS inverter 72. The RBB CMOS inverter 72 receives the input signal $V_{IN}$ and provides the output signal $V_{OUT}$, which is the logical complement of the input signal $V_{IN}$. As will be apparent to one of ordinary skill in the art, the RBB CMOS inverter 72 could alternatively be powered using a first DC power supply having a first voltage and a second DC power supply having a second voltage. It should be noted that the RBB CMOS inverter 72 is shown as a representative example. The present invention may include any RBB CMOS circuit, such as RBB NAND gates, RBB NOR gates, RBB latches, or RBB amplifiers. This embodiment of the present invention requires the first voltage to be positive relative to ground and the second voltage to be positive relative to ground and be between the first voltage and ground.

The isolation well RBB CMOS inverter 74 receives operating power from the DC power supply having the DC supply voltage $V_{SUPPLY}$, which is positive relative to ground, and ground having about zero voltage. The isolation well RBB CMOS inverter 74 receives the input signal $V_{IN}$ and provides the output signal $V_{OUT}$, which is the logical complement of the input signal $V_{IN}$. The isolation well RBB CMOS inverter 74 receives RBB from an RBB DC power supply, which has a negative RBB voltage $V_{RBB}$ relative to ground.

FIGS. 9A, 9B, and 9C show details of the traditional CMOS inverter 70, the RBB CMOS inverter 72, and the isolation well RBB CMOS inverter 74, respectively. The traditional CMOS inverter 70 includes a traditional P-type MOS (PMOS) transistor 76, which has a PMOS source connection 78, a PMOS drain connection 80, a PMOS gate connection 82, and a PMOS bulk connection 84, and a traditional NMOS transistor 86, which has an NMOS source connection 88, an NMOS drain connection 90, an NMOS gate connection 92, and an NMOS bulk connection 94. The PMOS source connection 78 is coupled to the PMOS bulk connection 84 and to the DC power supply, which has the DC supply voltage $V_{SUPPLY}$. The PMOS gate connection 82 is coupled to the NMOS gate connection 92 to form an inverter input, which receives the input signal $V_{IN}$. The PMOS drain connection 80 is coupled to the NMOS drain connection 90 to form an inverter output, which provides the output signal $V_{OUT}$. The NMOS source connection 88 is coupled to the NMOS bulk connection 94 and to ground.

As shown in FIG. 9B, the RBB CMOS inverter 72 includes the traditional PMOS transistor 76, which has the PMOS source connection 78, the PMOS drain connection 80, the PMOS gate connection 82, and the PMOS bulk connection 84, and an RBB NMOS transistor 96, which has the NMOS source connection 88, the NMOS drain connection 90, the NMOS gate connection 92, and the NMOS bulk connection 94. The PMOS source connection 78 is coupled to the PMOS bulk connection 84 and to the I/O DC power supply having the I/O DC supply voltage $V_{IOSUPPLY}$. The PMOS gate connection 82 is coupled to the NMOS gate connection 92 to form the inverter input, which receives the input signal $V_{IN}$. The PMOS drain connection 80 is coupled to the NMOS drain connection 90 to form the inverter output, which provides the output signal $V_{OUT}$. The NMOS source connection 88 is coupled to the core DC power supply having the core DC supply voltage $V_{CORESUPPLY}$. The NMOS bulk connection 94 is coupled to ground.

As shown in FIG. 9C, the isolation well RBB CMOS inverter 74 includes the traditional PMOS transistor 76, which has the PMOS source connection 78, the PMOS drain connection 80, the PMOS gate connection 82, and the PMOS bulk connection 84, and an isolation well RBB NMOS transistor 98, which has the NMOS source connection 88, the NMOS drain connection 90, the NMOS gate connection 92, and the NMOS bulk connection 94. The PMOS source connection 78 is coupled to the PMOS bulk connection 84 and to the DC power supply having the DC supply voltage $V_{SUPPLY}$. The PMOS gate connection 82 is coupled to the NMOS gate connection 92 to form the inverter input, which receives the input signal $V_{IN}$. The PMOS drain connection 80 is coupled to the NMOS drain connection 90 to form the inverter output, which provides the output signal $V_{OUT}$. The NMOS source connection 88 is coupled to ground. The NMOS bulk connection 94 is coupled to the RBB DC power supply, which has the negative RBB voltage $V_{RBB}$.

FIG. 10 shows details of the traditional NMOS transistor 86 illustrated in FIG. 9A, according to the prior art. The P-type semiconductor substrate 28 is used to form the traditional NMOS transistor 86, which includes the first source 34 and the first drain 36, both of which include N-type semiconductor material, the first gate 38, and the first bulk connection material 40, which may include highly-doped P-type semiconductor material. The P-type semiconductor substrate 28 provides a first body 100, which is electrically connected to ground through the first bulk connection material 40 and the NMOS bulk connection 94. The first source 34 is electrically connected to ground through the NMOS source connection 88. The first gate 38 is electrically coupled to the inverter input through the NMOS gate connection 92. The first drain 36 is electrically coupled to the inverter output through the NMOS drain connection 90. The isolation oxide 20 may separate the first source 34 from the first bulk connection material 40 and may separate the traditional NMOS transistor 86 from other devices (not shown).

FIG. 11 shows details of the traditional PMOS transistor 76 illustrated in FIG. 9A, according to the prior art. The P-type semiconductor substrate 28 is used to form the traditional PMOS transistor 76, which includes a first PMOS source 102 and a first PMOS drain 104, both of which include P-type semiconductor material, a first PMOS gate 106, and first PMOS bulk connection material 108, which may include highly-doped N-type semiconductor material. An N-well 110 is formed in the P-type semiconductor substrate 28 to provide a PMOS body for the traditional PMOS transistor 76. The PMOS body is electrically coupled to the DC power supply through the first PMOS bulk connection material 108 and the PMOS bulk connection 84. The first PMOS source 102 is electrically coupled to the DC power supply through the PMOS source connection 78. The first PMOS gate 106 is electrically coupled to the inverter input through the PMOS gate connection 82. The first PMOS drain 104 is electrically coupled to the inverter output through the PMOS drain connection 80. The isolation oxide 20 may separate the first PMOS source 102 from the first PMOS bulk connection material 108 and may separate the traditional PMOS transistor 76 from other devices (not shown).

FIG. 12 shows details of the RBB NMOS transistor 96 illustrated in FIG. 9B. The P-type semiconductor substrate 28 is used to form the RBB NMOS transistor 96, which includes the first source 34 and the first drain 36, both of which include N-type semiconductor material, the first gate 38, and the first bulk connection material 40, which may include highly-doped P-type semiconductor material. The P-type semiconductor substrate 28 provides the first body 100, which is electrically connected to ground through the first bulk connection material 40 and the NMOS bulk connection 94. Additionally, the first body 100 may be connected to ground through other passive materials having low electrical resistances. The first source 34 is electrically connected to the core DC power supply having the core DC supply voltage $V_{CORESUPPLY}$ through the NMOS source connection 88. Additionally, the first source 34 may be connected to the core DC power supply through other passive materials having low electrical resistances. The first gate 38 is electrically coupled to the inverter input through the NMOS gate connection 92. The first drain 36 is electrically coupled to the inverter output through the NMOS drain connection 90. The isolation oxide 20 may separate the first source 34 from the first bulk connection material 40 and may separate the RBB NMOS transistor 96 from other devices (not shown).

RBB involves applying a negative voltage to the first body 100 relative to the first source 34. Since the core DC supply voltage $V_{CORESUPPLY}$ is positive relative to ground, the first body 100 is negative relative to the first source 34. The negative body voltage associated with RBB may neutralize the effects of trapped positive charges in the isolation oxide 20, thereby radiation hardening the RBB NMOS transistor 96. Therefore, the RBB NMOS transistor 96 may be a two-edge NMOS transistor, which may take advantage of the small geometries associated with advancing semiconductor fabrication techniques. A level of RBB may be related to the magnitude of negative voltage at the first body 100 relative to the first source 34. Increasing magnitudes of negative voltage may provide increasing levels of RBB, which may provide increasing levels of TID radiation hardening. In some embodiments of the present invention, the magnitude of negative voltage may be significantly larger than the operating voltage level of the RBB NMOS transistor 96.

FIG. 13 shows details of the isolation well RBB NMOS transistor 98 illustrated in FIG. 9C. The P-type semiconductor substrate 28 is used to form the isolation well RBB NMOS transistor 98, which includes the first source 34 and the first drain 36, both of which include N-type semiconductor material, the first gate 38, and the first bulk connection material 40, which may include highly-doped P-type semiconductor material. The isolation well RBB NMOS transistor 98 includes a P-well 112, which provides a transistor body for the isolation well RBB NMOS transistor 98. The transistor body is electrically connected to the RBB DC power supply, which has the negative RBB voltage $V_{RBB}$, through the first bulk connection material 40 and the NMOS bulk connection 94. Additionally, the transistor body may be connected to the RBB DC power supply through other passive materials having low electrical resistances. The first source 34 is electrically connected to ground through the NMOS source connection 88. Additionally, the first source 34 may be connected to ground through other passive materials having low electrical resistances.

The first gate 38 is electrically coupled to the inverter input through the NMOS gate connection 92. The first drain 36 is electrically coupled to the inverter output through the NMOS drain connection 90. The isolation well RBB NMOS transistor 98 includes an N-well 114 between the P-well 112 and the P-type semiconductor substrate 28. The N-well 114 is electrically coupled to the DC power supply having the DC supply voltage $V_{SUPPLY}$ through N-well bulk connection material 116, which may be highly-doped N-type semiconductor material. The P-well 112 includes P-type semiconductor material and the N-well 114 includes N-type semiconductor material. Since the DC supply voltage $V_{SUPPLY}$ is positive and the negative RBB voltage $V_{RBB}$ is negative, a junction between the P-well 112 and the N-well 114 is reverse biased, which may provide isolation between the transistor body and the P-type semiconductor substrate 28. The isolation oxide 20 may separate the first source 34 from the first bulk connection material 40, may separate the first bulk connection material 40 from the N-well bulk connection material 116, and may separate the isolation well RBB NMOS transistor 98 from other devices (not shown).

RBB involves applying a negative voltage to the transistor body of the isolation well RBB NMOS transistor 98 relative to the first source 34. Since the negative RBB voltage $V_{RBB}$ is negative relative to ground, the transistor body is negative relative to the first source 34. The negative body voltage associated with RBB may neutralize the effects of trapped positive charges in the isolation oxide 20, thereby radiation hardening the isolation well RBB NMOS transistor 98. Therefore, the isolation well RBB NMOS transistor 98 may be a two-edge NMOS transistor, which may take advantage of the small geometries associated with advancing semiconductor fabrication techniques. A level of RBB may be related to the magnitude of negative voltage at the transistor body relative to the first source 34. Increasing magnitudes of negative voltage may provide increasing levels of RBB, which may provide increasing levels of TID radiation hardening. In some embodiments of the present invention, the magnitude of negative voltage may be significantly larger than the operating voltage level of the isolation well RBB NMOS transistor 98.

FIG. 14 shows an integrated circuit (IC) 118 providing isolation well RBB radiation hardened circuitry 120 and enclosed channel radiation hardened circuitry 122, according to one embodiment of the present invention. Both the isolation well RBB radiation hardened circuitry 120 and the enclosed channel radiation hardened circuitry 122 have DC power supply inputs $V_{SUPPLYIN}$ and ground inputs GND to receive operating power. IC inter-connection pads 124 may provide the DC supply voltage $V_{SUPPLY}$ to the DC power supply inputs $V_{SUPPLYIN}$ and ground to the ground inputs GND. The isolation well RBB radiation hardened circuitry 120 may include at least one isolation well RBB CMOS inverter 74 (not shown), at least one isolation well RBB NMOS transistor 98 (not shown) used with other circuitry (not shown), or both.

The isolation well RBB radiation hardened circuitry 120 uses isolation well RBB to provide radiation hardening; therefore, the isolation well RBB radiation hardened circuitry 120 has an RBB voltage input $V_{RBBIN}$. One of the IC inter-connection pads 124 may provide the negative RBB voltage $V_{RBB}$ to the RBB voltage input $V_{RBBIN}$. In an alternate embodiment of the present invention, the IC 118 includes a DC-to-DC converter (not shown), which uses the DC supply voltage $V_{SUPPLY}$ to provide the negative RBB voltage $V_{RBB}$. The enclosed channel radiation hardened circuitry 122 includes at least one enclosed channel NMOS transistor to provide radiation hardening. Input signals, output signals, other signals, or any combination thereof may be fed between the IC inter-connection pads 124, the isolation well RBB radiation hardened circuitry 120, the enclosed channel radiation hardened circuitry 122, or any combination thereof. Alternate embodiments of the present invention may omit either the isolation well RBB radiation hardened circuitry 120 or the enclosed channel radiation hardened circuitry 122. FIG. 15 shows details of the isolation well RBB radiation hardened circuitry 120 illustrated in FIG. 14, according to one embodiment of the isolation well RBB radiation hardened circuitry 120, which includes at least one isolation well RBB CMOS inverter 74. In an exemplary embodiment of the present invention, the DC supply voltage $V_{SUPPLY}$ is equal to about 1.8 volts and the negative RBB voltage $V_{RBB}$ is equal to about −1.0 volts.

FIG. 16 shows the IC 118 providing RBB radiation hardened circuitry 126, level shifting circuitry 128, and interface circuitry 130, according to an alternate embodiment of the present invention. The interface circuitry 130 has a DC power supply input $V_{SUPPLYIN}$ and a ground input GND to receive operating power. The RBB radiation hardened circuitry 126 has an I/O DC power supply input $V_{IOSUPPLYIN}$ and a core DC power supply input $V_{CORESUPPLYIN}$ to receive operating power, and a ground input GND to receive RBB. IC inter-connection pads 124 may provide the DC supply voltage $V_{SUPPLY}$ to the DC power supply input $V_{SUPPLYIN}$ and the I/O DC power supply input $V_{IOSUPPLYIN}$, may provide the core DC supply voltage $V_{CORESUPPLY}$ to the core DC power supply input $V_{CORESUPPLYIN}$, and may provide ground to the ground input GND of the RBB radiation hardened circuitry 126, the level shifting circuitry 128, and the interface circuitry 130. The DC supply voltage $V_{SUPPLY}$ is positive relative to ground and the core DC supply voltage $V_{CORESUPPLY}$ is positive with a magnitude between the DC supply voltage $V_{SUPPLY}$ and ground.

In a traditional IC 118, the interface circuitry 130 is associated with signals operating in a first voltage range, which is between the DC supply voltage $V_{SUPPLY}$ and ground, and core circuitry (not shown) is associated with signals operating in a second voltage range, which is between the core DC supply voltage $V_{CORESUPPLY}$ and ground. In the traditional IC 118, level shifting circuitry (not shown) must translate between first voltage range signals and second voltage range signals. However, in the alternate embodiment of the present invention, the interface circuitry 130 is associated with signals operating in the first voltage range, but the core circuitry, which is provided by the RBB radiation hardened circuitry 126, is associated with signals operating in a third voltage range, which is between the DC supply voltage $V_{SUPPLY}$ and the core DC supply voltage $V_{CORESUPPLY}$. The level shifting circuitry 128 must translate between the first voltage range signals and third voltage range signals.

The level shifting circuitry 128 has an I/O DC power supply input $V_{IOSUPPLYIN}$, a core DC power supply input $V_{CORESIN}$, and a ground input GND. Some circuitry (not shown) in the level shifting circuitry 128 receives operating power from the I/O DC power supply input $V_{IOSUPPLYIN}$ and the core DC power supply input $V_{CORESIN}$. Other circuitry (not shown) in the level shifting circuitry 128 receives operating power from the I/O DC power supply input $V_{IOSUPPLYIN}$ and the ground input GND. The IC inter-connection pads 124 may provide the DC supply voltage $V_{SUPPLY}$ to the I/O DC power supply input $V_{IOSUPPLYIN}$ of the level shifting circuitry 128, may provide the core DC supply voltage $V_{CORESUPPLY}$ to the core DC power supply input $V_{CORESIN}$, and may provide ground to the ground inputs GND of the level shifting circuitry 128 and the RBB radiation hardened circuitry 126.

The IC inter-connection pads 124 may provide a first input signal $V_{I1}$, a second input signal $V_{I2}$, and up to and including an Mth input signal $V_{IM}$ to the interface circuitry 130, which may buffer the first, second, and Mth input signals $V_{I1}$, $V_{I2}$, $V_{IM}$ to provide a first buffered input signal $V_{I1B}$, a second buffered input signal $V_{I2B}$, and up to and including an Mth buffered input signal $V_{IMB}$, respectively, to the level shifting circuitry 128. The level shifting circuitry 128 may level-shift the first, second, and Mth buffered input signals $V_{I1B}$, $V_{I2B}$, $V_{IMB}$ to provide a first level-shifted input signal $V_{I1LS}$, a second level-shifted input signal $V_{I2LS}$, and up to and including an Mth level-shifted input signal $V_{IMLS}$, respectively, to the RBB radiation hardened circuitry 126. The first, second, and Mth input signals $V_{I1}$, $V_{I2}$, $V_{IM}$ and the first, second, and Mth buffered input signals $V_{I1B}$, $V_{I2B}$, $V_{IMB}$ may operate over the first voltage range, and the first, second, and Mth level-shifted input signals $V_{I1LS}$, $V_{I2LS}$, $V_{IMLS}$ may operate over the third voltage range.

The RBB radiation hardened circuitry 126 may provide a first positive output signal $V_{O1P}$, a first negative output signal $V_{O1N}$, a second positive output signal $V_{O2P}$, a second negative output signal $V_{O2N}$, and up to and including an Mth positive output signal $V_{OMP}$ and an Mth negative output signal $V_{OMN}$ to the level shifting circuitry 128. The first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ are differential signals. Other embodiments of the present invention may use single-ended signals (not shown). The level shifting circuitry 128 may level-shift the first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ to provide a first output signal $V_{O1}$, a second output signal $V_{O2}$, and up to and including an Mth output signal $V_{OM}$, respectively, to the interface circuitry 130.

The interface circuitry 130 may buffer the first, second, and Mth output signals $V_{O1}$, $V_{O2}$, $V_{OM}$ to provide a first buffered output signal $V_{O1B}$, a second buffered output signal $V_{O2B}$, and up to and including an Mth buffered output signal $V_{OMB}$, respectively, to the IC inter-connection pads 124. The first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ may operate over the third voltage range, and the first, second, and Mth output signals $V_{O1}$, $V_{O2}$, $V_{OM}$ and the first, second, and Mth buffered output signals $V_{O1B}$, $V_{O2B}$, $V_{OMB}$ may operate over the first voltage range. In one embodiment of the present invention, the level shifting circuitry 128, the interface circuitry 130, or both may include at least one enclosed channel NMOS transistor to provide radiation hardening.

FIG. 17 shows the IC 118 providing the RBB radiation hardened circuitry 126, isolation well level shifting circuitry 132, and isolation well interface circuitry 134, according to an additional embodiment of the present invention. The isolation well interface circuitry 134 has a DC power supply input $V_{SUPPLYIN}$ and a ground input GND to receive operating power. The RBB radiation hardened circuitry 126 has the I/O DC power supply input $V_{IOSUPPLYIN}$ and the core DC power supply input $V_{CORESUPPLYIN}$ to receive operating power, and the ground input GND to receive RBB. The IC inter-connection pads 124 may provide the DC supply voltage $V_{SUPPLY}$ to the DC power supply input $V_{SUPPLYIN}$ and the I/O DC power supply input $V_{IOSUPPLYIN}$, provide the core DC supply voltage $V_{CORESUPPLY}$ to the core DC power supply input $V_{CORESUPPLYIN}$, and provide ground to the ground inputs GND of the RBB radiation hardened circuitry 126, the isolation well level shifting circuitry 132, and the isolation well interface circuitry 134. The DC supply voltage $V_{SUPPLY}$ is positive relative to ground and the core DC supply voltage $V_{CORESUPPLY}$ is positive with a magnitude between the DC supply voltage $V_{SUPPLY}$ and ground.

The isolation well interface circuitry 134 is associated with signals operating in the first voltage range, but the core circuitry, which is provided by the RBB radiation hardened circuitry 126, is associated with signals operating in the third voltage range. The isolation well level shifting circuitry 132 must translate between the first voltage range signals and the third voltage range signals.

The isolation well level shifting circuitry 132 has an I/O DC power supply input $V_{IOSUPPLYIN}$, a core DC power supply input $V_{CORESIN}$, and ground inputs GND. Some circuitry (not shown) in the isolation well level shifting circuitry 132 receives operating power from the I/O DC power supply input $V_{IOSUPPLYIN}$ and the core DC power supply input $V_{CORESIN}$. Other circuitry (not shown) in the isolation well level shifting circuitry 132 receives operating power from the I/O DC power supply input $V_{IOSUPPLYIN}$ and the ground inputs GND. The IC inter-connection pads 124 may provide the DC supply voltage $V_{SUPPLY}$ to the I/O DC power supply input $V_{IOSUPPLYIN}$ of the isolation well level shifting circuitry 132, provide the core DC supply voltage $V_{CORESUPPLY}$ to the core DC power supply input $V_{CORESIN}$, and provide ground to the ground inputs GND of the isolation well level shifting circuitry 132 and the RBB radiation hardened circuitry 126.

The IC inter-connection pads 124 may provide the first input signal $V_{I1}$, the second input signal $V_{I2}$, and up to and including the Mth input signal $V_{IM}$ to the isolation well interface circuitry 134, which may buffer the first, second, and Mth input signals $V_{I1}$, $V_{I2}$, $V_{IM}$ to provide the first buffered input signal $V_{I1B}$, the second buffered input signal $V_{I2B}$, and up to and including the Mth buffered input signal $V_{IMB}$, respectively, to the isolation well level shifting circuitry 132. The isolation well level shifting circuitry 132 may level-shift the first, second, and Mth buffered input signals $V_{I1B}$, $V_{I2B}$, $V_{IMB}$ to provide the first level-shifted input signal $V_{I1LS}$, the second level-shifted input signal $V_{I2LS}$, and up to and including the Mth level-shifted input signal $V_{IMLS}$, respectively, to the RBB radiation hardened circuitry 126. The first, second, and Mth input signals $V_{I1}$, $V_{I2}$, $V_{IM}$ and the first, second, and Mth buffered input signals $V_{I1B}$, $V_{I2B}$, $V_{IMB}$ may operate over the first voltage range, and the first, second, and Mth level-shifted input signals $V_{I1LS}$, $V_{I2LS}$, $V_{IMLS}$ may operate over the third voltage range.

The RBB radiation hardened circuitry 126 may provide the first positive output signal $V_{O1P}$, the first negative output signal $V_{O1N}$, the second positive output signal $V_{O2P}$, the second negative output signal $V_{O2N}$, and up to and including the Mth positive output signal $V_{OMP}$ and the Mth negative output signal $V_{OMN}$ to the isolation well level shifting circuitry 132. The first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ are differential signals. Other embodiments of the present invention may use single-ended signals (not shown). The isolation well level shifting circuitry 132 may level-shift the first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ to provide the first output signal $V_{O1}$, the second output signal $V_{O2}$, and up to and including the Mth output signal $V_{OM}$, respectively, to the isolation well interface circuitry 134.

The isolation well interface circuitry 134 may buffer the first, second, and Mth output signals $V_{O1}$, $V_{O2}$, $V_{OM}$ to provide the first buffered output signal $V_{O1B}$, the second buffered output signal $V_{O2B}$, and up to and including the Mth buffered output signal $V_{OMB}$, respectively, to the IC inter-connection pads 124. The first positive and negative output signals $V_{O1P}$, $V_{O1N}$, the second positive and negative output signals $V_{O2P}$, $V_{O2N}$, and the Mth positive and negative output signals $V_{OMP}$, $V_{OMN}$ may operate over the third voltage range, and the first, second, and Mth output signals $V_{O1}$, $V_{O2}$, $V_{OM}$ and the first, second, and Mth buffered output signals $V_{O1B}$, $V_{O2B}$, $V_{OMB}$ may operate over the first voltage range.

The isolation well level shifting circuitry 132 and the isolation well interface circuitry 134 use isolation well RBB to provide radiation hardening; therefore, the isolation well level shifting circuitry 132 and the isolation well interface circuitry 134 have RBB voltage inputs $V_{RBBIN}$. One of the IC inter-connection pads 124 may provide the negative RBB voltage $V_{RBB}$ to the RBB voltage inputs $V_{RBBIN}$. In an alternate embodiment of the present invention, the IC 118 includes a DC-to-DC converter (not shown), which uses the DC supply voltage $V_{SUPPLY}$, the core DC supply voltage $V_{CORESUPPLY}$, or both to provide the negative RBB voltage $V_{RBB}$. The isolation well level shifting circuitry 132, the isolation well interface circuitry 134, or both may include at least one isolation well RBB CMOS inverter 74 (not shown), at least one isolation well RBB NMOS transistor 98 (not shown) used with other circuitry (not shown), or both.

Other embodiments of the present invention may include the level shifting circuitry 128, the isolation well level shifting circuitry 132, the interface circuitry 130, the isolation well interface circuitry 134, or any combination thereof. In a first embodiment of the present invention, the DC supply voltage $V_{SUPPLY}$ is equal to about 3.3 volts and the core DC supply voltage $V_{CORESUPPLY}$ is equal to about 2.3 volts. In a second embodiment of the present invention, the DC supply voltage $V_{SUPPLY}$ is equal to about 2.5 volts and the core DC supply voltage $V_{CORESUPPLY}$ is equal to about 1.5 volts. In a third embodiment of the present invention, the DC supply voltage $V_{SUPPLY}$ is equal to about 1.8 volts and the core DC supply voltage $V_{CORESUPPLY}$ is equal to about 0.8 volts. In a fourth embodiment of the present invention, the DC supply voltage $V_{SUPPLY}$ is equal to about 1.5 volts and the core DC supply voltage $V_{CORESUPPLY}$ is equal to about 0.5 volts.

In a fifth embodiment of the present invention, the third voltage range is equal to about 0.8 volts. In a sixth embodiment of the present invention, the third voltage range is equal to about 0.9 volts. In a seventh embodiment of the present invention, the third voltage range is equal to about 1.0 volts. In an eighth embodiment of the present invention, the third voltage range is equal to about 1.1 volts. In a ninth embodiment of the present invention, the third voltage range is equal to about 1.2 volts. In a tenth embodiment of the present invention, the third voltage range is equal to about 1.3 volts.

In an eleventh embodiment of the present invention, the first voltage range is equal to about 1.5 volts. In a twelfth embodiment of the present invention, the first voltage range is equal to about 1.8 volts. In a thirteenth embodiment of the present invention, the first voltage range is equal to about 2.0 volts. In a fourteenth embodiment of the present invention, the first voltage range is equal to about 2.5 volts. In a fifteenth embodiment of the present invention, the first voltage range is equal to about 3.3 volts. In one embodiment of the present invention, the RBB radiation hardened circuitry 126 includes microprocessor circuitry, memory circuitry, static memory circuitry, dynamic memory circuitry, structured application specific IC (ASIC) circuitry, gate array circuitry, field programmable gate array (FPGA) circuitry, or any combination thereof. In another embodiment of the present invention, the isolation well RBB radiation hardened circuitry 120 includes microprocessor circuitry, memory circuitry, static memory circuitry, dynamic memory circuitry, structured ASIC circuitry, gate array circuitry, FPGA circuitry, or any combination thereof.

FIG. 18A shows details of the level shifting circuitry 128 and the interface circuitry 130 illustrated in FIG. 16. The interface circuitry 130 includes an extended input voltage range inverter 136, which may have thick gate oxides in its CMOS transistors to handle the first voltage range compared to CMOS transistors in the RBB radiation hardened circuitry 126, which have to handle only the third voltage range. The extended input voltage range inverter 136 in the interface circuitry 130 receives power using the DC supply voltage $V_{SUPPLY}$ and ground, and receives and inverts the first input signal $V_{I1}$ to provide the first buffered input signal $V_{I1B}$, both of which operate over the first voltage range. The level shifting circuitry 128 includes an extended input voltage range inverter 136, which may receive power using the DC supply voltage $V_{SUPPLY}$ and the core DC supply voltage $V_{CORESUPPLY}$, and receives, inverts, and level-shifts the first buffered input signal $V_{I1B}$ to provide the first level-shifted input signal $V_{I1LS}$, which operates over the third voltage range.

FIG. 18B shows details of the isolation well level shifting circuitry 132 and the isolation well interface circuitry 134 illustrated in FIG. 17. The isolation well interface circuitry 134 includes an isolation well extended input voltage range inverter 138, which may have thick gate oxides in its CMOS transistors to handle the first voltage range compared to CMOS transistors in the RBB radiation hardened circuitry 126, which have to handle only the third voltage range. The isolation well extended input voltage range inverter 138 in the isolation well interface circuitry 134 receives power using the DC supply voltage $V_{SUPPLY}$ and ground, and receives and inverts the first input signal $V_{I1}$ to provide the first buffered input signal $V_{I1B}$, both of which operate over the first voltage range. The isolation well level shifting circuitry 132 includes an isolation well extended input voltage range inverter 138, which may receive power using the DC supply voltage $V_{SUPPLY}$ and the core DC supply voltage $V_{CORESUPPLY}$, and receives, inverts, and level-shifts the first buffered input signal $V_{I1B}$ to provide the first level-shifted input signal $V_{I1LS}$, which operates over the third voltage range. The isolation well extended input voltage range inverters 138 use isolation well RBB to provide radiation hardening; therefore, the isolation well extended input voltage range inverters 138 use the negative RBB voltage $V_{RBB}$ for RBB.

FIG. 19 shows additional details of the RBB radiation hardened circuitry 126, the level shifting circuitry 128, and the interface circuitry 130 illustrated in FIG. 16. The RBB radiation hardened circuitry 126 includes an RBB CMOS inverter 72, which receives and inverts the first positive output signal $V_{O1P}$ to provide the first negative output signal $V_{O1N}$. The first positive and negative output signals $V_{O1P}$, $V_{O1N}$ operate over the third voltage range. The RBB CMOS inverter 72 is shown as a representative example; however, the RBB radiation hardened circuitry 126 may include any RBB CMOS circuit providing logic functions, analog functions, or both. The level shifting circuitry 128 includes a first extended input voltage range NMOS transistor 140, a second extended input voltage range NMOS transistor 142, a first extended input voltage range PMOS transistor 144, and a second extended input voltage range PMOS transistor 146. The first and second extended input voltage range NMOS and PMOS transistors 140, 142, 144, 146 may have thick gate oxides to handle the first voltage range compared to CMOS transistors in the RBB radiation hardened circuitry 126, which have to handle only the third voltage range. The first and second extended input voltage range NMOS and PMOS transistors 140, 142, 144, 146 receive power using the DC supply voltage $V_{SUPPLY}$ and ground.

The source and bulk connection of the first extended input voltage range PMOS transistor 144 are coupled together and receive the DC supply voltage $V_{SUPPLY}$. The source and bulk connection of the second extended input voltage range PMOS transistor 146 are coupled together and receive the DC supply voltage $V_{SUPPLY}$. The gate of the first extended input voltage range PMOS transistor 144 receives the first negative output signal $V_{O1N}$, and the gate of the second extended input voltage range PMOS transistor 146 receives the first positive output signal $V_{O1P}$. The source and bulk connection of the first extended input voltage range NMOS transistor 140 are coupled together and to ground. The source and bulk connection of the second extended input voltage range NMOS transistor 142 are coupled together and to ground. The drains of the first extended input voltage range NMOS and PMOS transistors 140, 144 and the gate of the second extended input voltage range NMOS transistor 142 are coupled together. The drains of the second extended input voltage range NMOS and PMOS transistors 142, 146 and the gate of the first extended input voltage range NMOS transistor 140 are coupled together and provide the first output signal $V_{O1}$.

The level shifting circuitry 128 level shifts the first positive and negative output signals $V_{O1P}$, $V_{O1N}$, which operate over the third voltage range, to provide the first output signal $V_{O1}$, which operates over the first voltage range. For example, if the first positive output signal $V_{O1P}$ is HIGH and the first negative output signal $V_{O1N}$ is LOW, then the first extended input voltage range PMOS transistor 144 is ON and the second extended input voltage range PMOS transistor 146 is OFF. Therefore, the gate of the second extended input voltage range NMOS transistor 142 is HIGH and the second extended input voltage range NMOS transistor 142 is ON, which drives the gate of the first extended input voltage range NMOS transistor 140 LOW and the first extended input voltage range NMOS transistor 140 is OFF, which is a stable condition without contention and the first output signal $V_{O1}$ is LOW.

Conversely, if the first positive output signal $V_{O1P}$ is LOW and the first negative output signal $V_{O1N}$ is HIGH, then the first extended input voltage range PMOS transistor 144 is OFF and the second extended input voltage range PMOS transistor 146 is ON. Therefore, the gate of the first extended input voltage range NMOS transistor 140 is HIGH and the first extended input voltage range NMOS transistor 140 is ON, which drives the gate of the second extended input voltage range NMOS transistor 142 LOW and the second extended input voltage range NMOS transistor 142 is OFF, which is a stable condition without contention and the first output signal $V_{O1}$ is HIGH. The first extended input voltage range NMOS transistor 140, the second extended input voltage range NMOS transistor 142, or both are enclosed channel NMOS transistors to provide radiation hardening. The first and second extended input voltage range NMOS transistors 140, 142 may be enclosed channel NMOS transistors. Intra-device leakage paths between non-RBB radiation hardened transistors, such as the first and second extended input voltage range NMOS transistors 140, 142 may be alleviated through the use of guard-rings in the circuit layout of the first and second extended input voltage range NMOS transistors 140, 142. The interface circuitry 130 includes an extended input voltage range inverter 136, which receives and inverts the first output signal $V_{O1}$ to provide the first buffered output signal $V_{O1B}$.

FIG. 20 shows additional details of the RBB radiation hardened circuitry 126, the isolation well level shifting circuitry 132, and the isolation well interface circuitry 134 illustrated in FIG. 17. The RBB radiation hardened circuitry 126 includes the RBB CMOS inverter 72, which receives and inverts the first positive output signal $V_{O1P}$ to provide the first negative output signal $V_{O1N}$. The first positive and negative output signals $V_{O1P}$, $V_{O1N}$ operate over the third voltage range. The isolation well level shifting circuitry 132 includes a first isolation well extended input voltage range NMOS transistor 148, a second isolation well extended input voltage range NMOS transistor 150, the first extended input voltage range PMOS transistor 144, and the second extended input voltage range PMOS transistor 146. The first and second isolation well extended input voltage range NMOS transistors 148, 150 and the first and second extended input voltage range PMOS transistors 144, 146 may have thick gate oxides to handle the first voltage range compared to CMOS transistors in the RBB radiation hardened circuitry 126, which have to handle only the third voltage range. The first and second isolation well extended input voltage range NMOS transistors 148, 150 and the first and second extended input voltage range PMOS transistors 144, 146 receive power using the DC supply voltage $V_{SUPPLY}$ and ground. The first and second isolation well extended input voltage range NMOS transistors 148, 150 may be two-edge NMOS transistors.

The source and bulk connection of the first extended input voltage range PMOS transistor 144 are coupled together and receive the DC supply voltage $V_{SUPPLY}$. The source and bulk connection of the second extended input voltage range PMOS transistor 146 are coupled together and receive the DC supply voltage $V_{SUPPLY}$. The gate of the first extended input voltage range PMOS transistor 144 receives the first negative output signal $V_{O1N}$, and the gate of the second extended input voltage range PMOS transistor 146 receives the first positive output signal $V_{O1P}$. The source of the first isolation well extended input voltage range NMOS transistor 148 is coupled to ground. The source of the second isolation well extended input voltage range NMOS transistor 150 is coupled to ground. The drain of the first isolation well extended input voltage range NMOS transistor 148, the drain of the first extended input voltage range PMOS transistors 144, and the gate of the second isolation well extended input voltage range NMOS transistor 150 are coupled together. The drain of the second isolation well extended input voltage range NMOS transistor 150, the drain of the second extended input voltage range PMOS transistors 146, and the gate of the first isolation well extended input voltage range NMOS transistor 148 are coupled together and provide the first output signal $V_{O1}$.

The isolation well level shifting circuitry 132 level shifts the first positive and negative output signals $V_{O1P}$, $V_{O1N}$, which operate over the third voltage range, to provide the first output signal $V_{O1}$, which operates over the first voltage range. For example, if the first positive output signal $V_{O1P}$ is HIGH and the first negative output signal $V_{O1N}$ is LOW, then the first extended input voltage range PMOS transistor 144 is ON and the second extended input voltage range PMOS transistor 146 is OFF. Therefore, the gate of the second isolation well extended input voltage range NMOS transistor 150 is HIGH and the second isolation well extended input voltage range NMOS transistor 150 is ON, which drives the gate of the first isolation well extended input voltage range NMOS transistor 148 LOW and the first isolation well extended input voltage range NMOS transistor 148 is OFF, which is a stable condition without contention and the first output signal $V_{O1}$ is LOW.

Conversely, if the first positive output signal $V_{O1P}$ is LOW and the first negative output signal $V_{O1N}$ is HIGH, then the first extended input voltage range PMOS transistor 144 is OFF and the second extended input voltage range PMOS transistor 146 is ON. Therefore, the gate of the first isolation well extended input voltage range NMOS transistor 148 is HIGH and the first isolation well extended input voltage range NMOS transistor 148 is ON, which drives the gate of the second isolation well extended input voltage range NMOS transistor 150 LOW and the second isolation well extended input voltage range NMOS transistor 150 is OFF, which is a stable condition without contention and the first output signal $V_{O1}$ is HIGH. The first isolation well extended input voltage range NMOS transistor 148 and the second isolation well extended input voltage range NMOS transistor 150 are both isolation well RBB NMOS transistors to provide radiation hardening. Therefore, the bulk connections of the first and second isolation well extended input voltage range NMOS transistors 148, 150 receive the negative RBB voltage $V_{RBB}$. The isolation well interface circuitry 134 includes an isolation well extended input voltage range inverter 138, which receives and inverts the first output signal $V_{O1}$ to provide the first buffered output signal $V_{O1B}$.

FIG. 21 shows details of the IC 118, according to one embodiment of the present invention. The IC 118 includes a single semiconductor die 152, which provides the IC inter-connection pads 124. FIG. 22 shows details of the IC 118, according to an alternate embodiment of the present invention. The IC 118 includes a first semiconductor die 154 and a second semiconductor die 156 mounted to a die mounting substrate 158. The first and second semiconductor dies 154, 156 provide the IC inter-connection pads 124. Any or all of the single, first, and second semiconductor dies 152, 154, 156 may be a Silicon semiconductor die. In one embodiment of the present invention, the IC 118 may include isolation well RBB radiation hardened circuitry 120, enclosed channel radiation hardened circuitry 122, RBB radiation hardened circuitry 126, level shifting circuitry 128, interface circuitry 130, isolation well level shifting circuitry 132, isolation well interface circuitry 134, or any combination thereof.

As will be apparent to one of ordinary skill in the art, the term "ground," as used in the present invention, refers to a DC reference having a reference voltage of about zero volts. The term ground does not refer to an earth ground or any potential associated with earth ground; therefore, the present invention includes any voltage potential between ground and an earth ground.

Some of the circuitry previously described may use discrete circuitry, integrated circuitry, application specific integrated circuitry, gate arrays, programmable gate arrays, field programmable gate arrays, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, digital signal processors (DSPs), the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A radiation hardened integrated circuit (IC) comprising:
   a ground node;
   a first voltage node configured to receive a first voltage between the first voltage node and ground;
   a second voltage node configured to receive a second voltage between the second voltage node and ground, such that a magnitude of the second voltage is between a magnitude of the first voltage and a magnitude of ground;
   interface circuitry coupled between and configured to receive operating power from the first voltage node and the ground node; and
   core circuitry:
      coupled between and configured to receive operating power from the first voltage node and the second voltage node; and
      comprising a plurality of N-type metal-oxide-semiconductor (NMOS) transistors having a plurality of sources connected to the second voltage node and a plurality of bodies connected to the ground node,
   wherein applying the second voltage to the plurality of sources and applying ground to the plurality of bodies provides reverse body biasing (RBB) to the plurality of NMOS transistors.

2. The radiation hardened IC of claim 1 wherein a level of RBB is based on a desired level of total ionizing dose (TID) radiation hardening.

3. The radiation hardened IC of claim 1 wherein the plurality of bodies are connected to the ground node through a plurality of bulk connections.

4. The radiation hardened IC of claim 1 wherein a Silicon semiconductor die provides the interface circuitry and the core circuitry.

5. The radiation hardened IC of claim 1 wherein the first voltage node is positive relative to ground and the second voltage node is positive relative to ground.

6. The radiation hardened IC of claim 1 wherein:
   first signals associated with the interface circuitry operate over a first voltage range having a magnitude equal to the magnitude of first voltage; and
   second signals associated with the core circuitry operate over a second voltage range having a magnitude between the magnitude of the first voltage and the magnitude of the second voltage.

7. The radiation hardened IC of claim 6 further comprising level shifting circuitry adapted to translate between the first signals and the second signals.

8. The radiation hardened IC of claim 7 wherein the level shifting circuitry comprises at least one enclosed channel NMOS transistor.

9. The radiation hardened IC of claim 8 wherein the interface circuitry comprises the at least one enclosed channel NMOS transistor.

10. The radiation hardened IC of claim 1 wherein the interface circuitry comprises at least one enclosed channel NMOS transistor.

11. The radiation hardened IC of claim 1 further comprising a negative voltage node configured to receive a negative voltage, wherein the interface circuitry comprises a plurality of isolation well NMOS transistors comprising:
   a plurality of isolation well transistor bodies provided by a plurality of P-wells, wherein each of the plurality of isolation well transistor bodies is connected to the negative voltage node;
   a plurality of N-wells, wherein each of the plurality of N-wells is between a corresponding one of each of the plurality of P-wells and a substrate, and each N-well is coupled to the first voltage node; and
   a plurality of isolation well sources, wherein each isolation well source is connected to the ground node,
wherein applying ground to each isolation well source and applying the negative voltage to each isolation well transistor body provides RBB to the plurality of isolation well NMOS transistors, and applying the negative voltage to each isolation well transistor body and applying the first voltage to each N-well substantially isolates each isolation well transistor body from the substrate.

12. The radiation hardened IC of claim 1 further comprising:
   a negative voltage node configured to receive a negative voltage; and
   isolation well RBB radiation hardened circuitry comprising a plurality of isolation well NMOS transistors comprising:
      a plurality of isolation well transistor bodies provided by a plurality of P-wells, wherein each of the plurality of isolation well transistor bodies is connected to the negative voltage node;
      a plurality of N-wells, wherein each of the plurality of N-wells is between a corresponding one of each of the plurality of P-wells and a substrate, and each N-well is coupled to the first voltage node; and
      a plurality of isolation well sources, wherein each isolation well source is connected to the ground node, wherein applying ground to each isolation well source and applying the negative voltage to each isolation well transistor body provides RBB to the plurality of isolation well NMOS transistors, and applying the negative voltage to each isolation well transistor body and applying the first voltage to each N-well substantially isolates each isolation well transistor body from the substrate.

13. The radiation hardened IC of claim 12 further comprising a DC-to-DC converter adapted to:
receive at least one of the first voltage and the second voltage; and
provide the negative voltage based on the at least one of the first voltage and the second voltage.

14. The radiation hardened IC of claim 1 further comprising enclosed channel radiation hardened circuitry having at least one enclosed channel NMOS transistor.

15. The radiation hardened IC of claim 1 wherein the core circuitry further comprises static memory circuitry.

16. The radiation hardened IC of claim 1 wherein the core circuitry further comprises at least one of static memory circuitry, dynamic memory circuitry, structured application specific IC (ASIC) circuitry, gate array circuitry, and field programmable gate array (FPGA) circuitry.

17. The radiation hardened IC of claim 1 wherein the magnitude of the first voltage is equal to about 3.3 volts and the magnitude of the second voltage is equal to about 2.3 volts.

18. The radiation hardened IC of claim 1 wherein the magnitude of the first voltage is equal to about 2.5 volts and the magnitude of the second voltage is equal to about 1.5 volts.

19. The radiation hardened IC of claim 1 wherein the magnitude of the first voltage is equal to about 1.8 volts and the magnitude of the second voltage is equal to about 0.8 volts.

20. The radiation hardened IC of claim 1 wherein the magnitude of the first voltage is equal to about 1.5 volts and the magnitude of the second voltage is equal to about 0.5 volts.

* * * * *